(12) United States Patent
Wallikewitz et al.

(10) Patent No.: US 10,205,107 B2
(45) Date of Patent: Feb. 12, 2019

(54) ORGANIC LIGHT-EMITTING DIODE (OLED) INCLUDING AN ELECTRON TRANSPORT LAYER STACK COMPRISING DIFFERENT LITHIUM COMPOUNDS

(71) Applicant: Novaled GmbH, Dresden (DE)

(72) Inventors: Bodo Wallikewitz, Dresden (DE); Carsten Rothe, Dresden (DE)

(73) Assignee: Novaled GmbH, Dresden (DE)

( * ) Notice: Subject to any disclaimer, the term of this patent is extended or adjusted under 35 U.S.C. 154(b) by 80 days.

(21) Appl. No.: 15/323,782

(22) PCT Filed: Jul. 1, 2015

(86) PCT No.: PCT/EP2015/064941
§ 371 (c)(1),
(2) Date: Jan. 4, 2017

(87) PCT Pub. No.: WO2016/001283
PCT Pub. Date: Jan. 7, 2016

(65) Prior Publication Data
US 2017/0170411 A1    Jun. 15, 2017

(30) Foreign Application Priority Data
Jul. 4, 2014   (EP) .................................... 14175816

(51) Int. Cl.
*H01L 51/00*   (2006.01)
*H01L 51/56*   (2006.01)
*H01L 51/50*   (2006.01)

(52) U.S. Cl.
CPC ........ *H01L 51/0077* (2013.01); *H01L 51/001* (2013.01); *H01L 51/0003* (2013.01);
(Continued)

(58) Field of Classification Search
CPC ........... H01L 2251/301; H01L 51/0003; H01L 51/001; H01L 51/0054; H01L 51/0058;
(Continued)

(56) References Cited

U.S. PATENT DOCUMENTS

2006/0204786 A1* 9/2006 Begley .................. C09K 11/06
428/690
2006/0214553 A1* 9/2006 Nagara .................. H01L 51/50
313/483

(Continued)

OTHER PUBLICATIONS

PCT International Search Report and Written Opinion for PCT Application No. PCT/EP2015/064941 dated Sep. 9, 2015.

*Primary Examiner* — Dawn L Garrett
(74) *Attorney, Agent, or Firm* — Eversheds Sutherland (US) LLP

(57) ABSTRACT

The present invention relates to a an organic light-emitting diode (OLED) (100) comprising an emission layer and an electron transport layer stack of at least two electron transport layers (160/161), wherein a first electron transport layer (161) and a second electron transport layer (162) comprises at least one matrix compound and in addition, —the first electron transport layer (161) comprises a first lithium halide or a first lithium organic complex; and —the second electron transport layer (162) comprises a second lithium halide or a second lithium organic complex, wherein the first lithium organic complex is not the same as the second lithium organic complex; and wherein the first lithium halide is not the same as the second lithium halide.

29 Claims, 1 Drawing Sheet

(52) U.S. Cl.
CPC ........ *H01L 51/008* (2013.01); *H01L 51/0054* (2013.01); *H01L 51/0058* (2013.01); *H01L 51/0072* (2013.01); *H01L 51/508* (2013.01); *H01L 51/56* (2013.01); *H01L 51/0071* (2013.01); *H01L 2251/301* (2013.01)

(58) Field of Classification Search
CPC ............. H01L 51/0072; H01L 51/0077; H01L 51/008; H01L 51/508; H01L 51/56
See application file for complete search history.

(56) References Cited

U.S. PATENT DOCUMENTS

| | | | |
|---|---|---|---|
| 2006/0246315 A1* | 11/2006 | Begley | C09K 11/06 |
| | | | 428/690 |
| 2006/0286405 A1* | 12/2006 | Begley | C09K 11/06 |
| | | | 428/690 |
| 2008/0032123 A1* | 2/2008 | Spindler | H01L 51/0054 |
| | | | 428/336 |
| 2009/0162644 A1* | 6/2009 | Ricks | H01L 51/0052 |
| | | | 428/332 |
| 2013/0228753 A1 | 9/2013 | Moon et al. | |
| 2014/0197401 A1* | 7/2014 | Kroeber | H01L 51/0067 |
| | | | 257/40 |
| 2015/0144897 A1 | 5/2015 | Kang et al. | |

\* cited by examiner

ORGANIC LIGHT-EMITTING DIODE (OLED) INCLUDING AN ELECTRON TRANSPORT LAYER STACK COMPRISING DIFFERENT LITHIUM COMPOUNDS

CROSS REFERENCE TO RELATED APPLICATIONS

This application is a U.S. national stage application of PCT/EP2015/064941, filed Jul. 1, 2015, which claims priority to European Application No. 14175816.9, filed Jul. 4, 2014. The contents of these applications are hereby incorporated by reference.

The present invention relates to an organic light-emitting diode (OLED) including an electron transport layer stack, and a method of manufacturing the same.

DESCRIPTION OF THE RELATED ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency and/or a long lifetime.

SUMMARY

Aspects of the present invention provide a method of increasing the efficiency, in particular the efficiency, measured in cd/A, divided by CIE-y, especially for blue emitting OLEDs, and/or the lifetime, for top and/or bottom emission organic light-emitting diodes (OLED). The invention relates to an organic light-emitting diode (OLED) comprising an emission layer and an electron transport layer stack (ETL) as well as a method of manufacturing the same.

According to an aspect of the present invention, there is provided an organic light-emitting diode (OLED) comprising an emission layer and an electron transport layer stack of at least two electron transport layers, wherein a first electron transport layer and a second electron transport layer comprises at least one matrix compound and in addition,
the first electron transport layer comprises a first lithium halide or a first lithium organic complex; and
the second electron transport layer comprises a second lithium halide or a second lithium organic complex; wherein the first lithium halide or lithium organic complex is not the same as the second lithium halide or lithium organic complex.

According to an aspect of the present invention, there is provided an organic light-emitting diode (OLED) comprising an emission layer and an electron transport layer stack of at least two electron transport layers, wherein a first electron transport layer and a second electron transport layer comprises the same matrix compound and in addition,
the first electron transport layer comprises a first lithium halide or a first lithium organic complex; and
the second electron transport layer comprises a second lithium halide or a second lithium organic complex; wherein the first lithium halide or lithium organic complex is not the same as the second lithium halide or lithium organic complex.

According to an aspect of the present invention, there is provided an organic light-emitting diode (OLED) comprising an emission layer and an electron transport layer stack of at least two electron transport layers, wherein a first electron transport layer and a second electron transport layer comprises at least one matrix compound and in addition,
the first electron transport layer comprises a first lithium halide or a first lithium organic complex; and
the second electron transport layer comprises a second lithium halide or a second lithium organic complex; wherein the first lithium halide or lithium organic complex is not the same as the second lithium halide or lithium organic complex;
wherein the matrix compound is free of an anthracene based compound and free of a hetero substituted anthracene based compound.

According to an aspect of the present invention, there is provided an organic light-emitting diode (OLED) comprising an emission layer and an electron transport layer stack of at least two electron transport layers, wherein a first electron transport layer and a second electron transport layer comprises the same matrix compound and in addition,
the first electron transport layer comprises a first lithium halide or a first lithium organic complex; and
the second electron transport layer comprises a second lithium halide or a second lithium organic complex; wherein the first lithium halide or lithium organic complex is not the same as the second lithium halide or lithium organic complex;
wherein the matrix compound is free of an anthracene based compound and free of a hetero substituted anthracene based compound.

According to an aspect of the present invention, there is provided an organic light-emitting diode (OLED) comprising an emission layer and an electron transport layer stack of at least two electron transport layers, wherein a first electron transport layer and a second electron transport layer comprises at least one matrix compound and in addition,
the first electron transport layer comprises a first lithium halide or a first lithium organic complex; and
the second electron transport layer comprises a second lithium halide or a second lithium organic complex; wherein the first lithium halide or lithium organic complex is not the same as the second lithium halide or lithium organic complex;
wherein the matrix compound of the first electron transport layer and the second electron transport layer is a phosphine oxide based compound and/or a substituted phenanthroline compound.

According to an aspect of the present invention, there is provided an organic light-emitting diode (OLED) comprising an emission layer and an electron transport layer stack of at least two electron transport layers, wherein a first electron transport layer and a second electron transport layer comprises at least one matrix compound and in addition,
the first electron transport layer comprises a first lithium halide or a first lithium organic complex; and the second electron transport layer comprises a second lithium halide or a second lithium organic complex; wherein the first lithium halide or lithium organic complex is not the same as the second lithium halide or lithium organic complex;

wherein the matrix compound of the first electron transport layer and the second electron transport layer is the same phosphine oxide based compound and/or the same substituted phenanthroline compound.

According to an aspect of the present invention, there is provided an organic light-emitting diode (OLED) comprising an emission layer and an electron transport layer stack of at least two electron transport layers, wherein a first electron transport layer and a second electron transport layer comprises at least one matrix compound and in addition, the first electron transport layer comprises a first lithium halide or a first lithium organic complex; and the second electron transport layer comprises a second lithium halide or a second lithium organic complex; wherein the first lithium halide or lithium organic complex is not the same as the second lithium halide or lithium organic complex;

wherein the matrix compound of the first electron transport layer and the second electron transport layer is a phosphine oxide based compound.

According to an aspect of the present invention, there is provided an organic light-emitting diode (OLED) comprising an emission layer and an electron transport layer stack of at least two electron transport layers, wherein a first electron transport layer and a second electron transport layer comprises at least one matrix compound and in addition, the first electron transport layer comprises a first lithium halide or a first lithium organic complex; and the second electron transport layer comprises a second lithium halide or a second lithium organic complex; wherein the first lithium halide or lithium organic complex is not the same as the second lithium halide or lithium organic complex;

wherein the matrix compound of the first electron transport layer and the second electron transport layer is the same phosphine oxide based compound.

According to an aspect of the present invention, there is provided an organic light-emitting diode (OLED) comprising an emission layer and an electron transport layer stack of at least two electron transport layers, wherein a first electron transport layer and a second electron transport layer comprises at least one matrix compound and in addition, the first electron transport layer comprises a first lithium halide or a first lithium organic complex; and the second electron transport layer comprises a second lithium halide or a second lithium organic complex; wherein the first lithium halide or lithium organic complex is not the same as the second lithium halide or lithium organic complex;

wherein the matrix compound of the first electron transport layer and the second electron transport layer is a substituted phenanthroline compound.

According to an aspect of the present invention, there is provided an organic light-emitting diode (OLED) comprising an emission layer and an electron transport layer stack of at least two electron transport layers, wherein a first electron transport layer and a second electron transport layer comprises at least one matrix compound and in addition, the first electron transport layer comprises a first lithium halide or a first lithium organic complex; and the second electron transport layer comprises a second lithium halide or a second lithium organic complex; wherein the first lithium halide or lithium organic complex is not the same as the second lithium halide or lithium organic complex;

wherein the matrix compound of the first electron transport layer and the second electron transport layer is the same substituted phenanthroline compound.

According to an aspect of the present invention, there is provided an organic light-emitting diode (OLED) comprising an emission layer and an electron transport layer stack of at least two electron transport layers, wherein a first electron transport layer and a second electron transport layer comprises at least one matrix compound and in addition, the first electron transport layer comprises a first lithium halide or first lithium organic complex; and the second electron transport layer comprises a second lithium halide or second lithium organic complex; wherein the first lithium organic complex is not the same as the second lithium organic complex and wherein the first lithium halide is not the same as the second lithium halide.

According to various embodiments of the present invention, there is provided an organic light-emitting diode (OLED) comprising an emission layer and an electron transport layer stack of at least two electron transport layers, wherein a first electron transport layer and a second electron transport layer comprises at least one matrix compound and in addition, the first electron transport layer comprises a first lithium halide or a first lithium organic complex; and the second electron transport layer comprises a second lithium halide or a second lithium organic complex; wherein the first lithium organic complex is not the same as the second lithium organic complex and wherein the first lithium halide is not the same as the second lithium halide;

wherein the first electron transport layer is arranged closest to an emission layer and the second electron transport layer is arranged closest to a cathode.

According to various embodiments of the present invention, there is provided an organic light-emitting diode (OLED) comprising an emission layer and an electron transport layer stack of at least two electron transport layers, wherein a first electron transport layer and a second electron transport layer comprises at least one matrix compound and in addition, the first electron transport layer comprises a first lithium organic complex; and the second electron transport layer comprises a second lithium organic complex;

wherein the first lithium organic complex is not the same as the second lithium organic complex; and wherein the first electron transport layer is arranged closest to an emission layer and the second electron transport layer is arranged closest to a cathode.

The organic light-emitting diode (OLED) can be a bottom emission OLED or a top emission OLED.

For the following defined terms, these definitions shall be applied, unless a different definition is given in the claims or elsewhere in this specification.

The color space is described by coordinates CIE-x and CIE-y (International Commission on Illumination 1931). For blue emission the CIE-y is of particular importance. A smaller CIE-y denotes a deeper blue color. The efficiency of OLEDs is recorded in cd/A. Candela is a SI base unit of luminous intensity and describes the power emitted by a light source in a particular direction, weighted by the luminosity function (a standardized model of the sensitivity of the human eye to different wavelengths). The human eye is particularly insensitive to deep blue and deep red colors. Therefore, the efficiency measured in cd/A is corrected for the emission color, in the case of blue emission, the CIE-y. For example, a deeper blue OLED would have a lower cd/A efficiency even if the quantum efficiency (photons in compared to photons out) is the same. By dividing the efficiency measured in cd/A by the CIE-y, the efficiency of OLEDs with slightly different shades of blue can be compared.

The efficiency, also named Eff., is measured in Candela per Ampere (cd/A) and divided by the CIE-y.

The term "not the same as" with respect to the lithium organic complex means that the first electron transport layer comprises a first lithium halide or a first lithium organic complex having a different chemical structure to the second lithium organic complex of the second electron transport layer. Thus the first electron transport layer and the second electron transport layer differs in at least in the chemical structure of their respective lithium organic complex.

The term "OLED" and "organic light-emitting diode" is simultaneously used and having the same meaning.

As used herein, "weight percent", "wt.-%", "percent by weight", "% by weight", and variations thereof refer to a composition, component, substance or agent as the weight of that composition, component, substance or agent of the respective electron transport layer divided by the total weight of the composition thereof and multiplied by 100. It is understood that the total weight percent amount of all components, substances or agents of the respective electron transport layer are selected such that it does not exceed 100 wt.-%.

All numeric values are herein assumed to be modified by the term "about", whether or not explicitly indicated. As used herein, the term "about" refers to variation in the numerical quantity that can occur. Whether or not, modified by the term "about", the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

The term "alkyl" refers to straight-chain or branched alkyl groups. The term "1 to 20 carbon atoms" as used herein refers to straight-chain or branched alkyl groups having 1 to 20 carbon atoms. The alkyl groups can be selected from the group comprising methyl, ethyl and the isomers of propyl, butyl or pentyl, such as isopropyl, isobutyl, tert.-butyl, sec.-butyl and/or isopentyl. The term "aryl" refers to aromatic groups for example phenyl or naphthyl.

Herein, when a first element is referred to as being formed or disposed "on" a second element, the first element can be disposed directly on the second element or one or more other elements may be disposed there between. When a first element is referred to as being formed or disposed "directly on" a second element, no other elements are disposed there between.

According to various embodiments of the OLED the electron transport layer stack comprising the first electron transport layer and second electron transport layer may be free of a lithium halide.

According to various embodiments of the OLED the electron transport layer stack comprising the first electron transport layer and second electron transport layer may be free of a lithium inorganic salt.

According to various embodiments of the OLED the electron transport layer stack comprising the first electron transport layer and second electron transport layer may contains as a lithium compound a lithium organic complex only.

According to various embodiments of the OLED the first electron transport layer comprises about ≥10 wt.-% to about ≤70 wt.-%, preferably about ≥20 wt.-% to about ≤65 wt.-% and also preferred about ≥50 wt.-% to about ≤60 wt.-% of a first lithium halide or a first lithium organic complex; and the second electron transport layer comprises about ≥10 wt.-% to about ≤70 wt.-%, preferably about ≥20 wt.-% to about ≤65 wt.-% and also preferred about ≥50 wt.-% to about ≤60 wt.-% of a second lithium halide or a second lithium organic complex; wherein the weight percent of the a first lithium halide or a first lithium organic complex is based on the total weight of the corresponding first electron transport layer and the weight percent of the a second lithium halide and a second lithium organic complex is based on the total weight of the corresponding second electron transport layer.

According to various embodiments of the OLED of the present invention the first lithium halide or second lithium halide can be selected from the group comprising LiF, LiCl, LiBr and LiJ, wherein the wherein the first lithium halide is not the same as the second lithium halide. However, most preferred is LiF.

According to various embodiments of the OLED of the present invention the organic ligand of the lithium organic complex can be a quinolate. Preferably the lithium organic complex is a lithium organic complex of formula I, II or III:

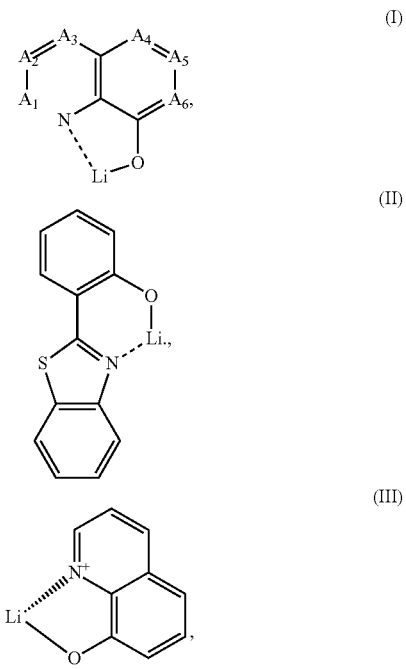

wherein
A1 to A6 are same or independently selected from CH, CR, N, O;
R is same or independently selected from hydrogen, halogen, alkyl or aryl or heteroaryl with 1 to 20 carbon atoms; and more preferred A1 to A6 are CH.

Quinolates that can be suitable used are disclosed in WO 2013079217 A1 and incorporated by reference.

According to various embodiments of the OLED of the present invention the organic ligand of the lithium organic complex can be a borate based organic ligand, Preferably the lithium organic complex is a lithium tetra(1H-pyrazol-1-yl)borate. Borate based organic ligands that can be suitable used are disclosed in WO 2013079676 A1 and incorporated by reference.

According to various embodiments of the OLED of the present invention the organic ligand of the lithium organic complex can be a phenolate ligand, Preferably the lithium organic complex is a lithium 2-(diphenylphosphoryl)phenolate. Phenolate ligands that can be suitable used are disclosed in WO 2013079678 A1 and incorporated by reference.

Further, phenolate ligands can be selected from the group of pyridinolate, preferably 2-(diphenylphosphoryl)pyridin-3-olate. Pyridine phenolate ligands that can be suitable used are disclosed in JP 2008195623 and incorporated by reference.

In addition, phenolate ligands can be selected from the group of imidazol phenolates, preferably 2-(1-phenyl-1H-benzo[d]imidazol-2-yl)phenolate. Imidazol phenolate ligands that can be suitable used are disclosed in JP 2001291593 and incorporated by reference.

Also, phenolate ligands can be selected from the group of oxazol phenolates, preferably 2-(benzo[d]oxazol-2-yl)phenolate. Oxazol phenolate ligands that can be suitable used are disclosed in US 20030165711 and incorporated by reference.

Lithium Schiff base organic complexes can be use. Lithium Schiff base organic complexes that can be suitable used having the structure 100, 101, 102 or 103:

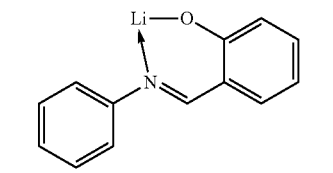
100

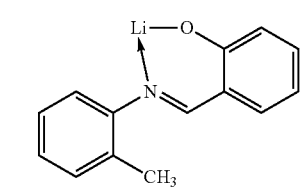
101

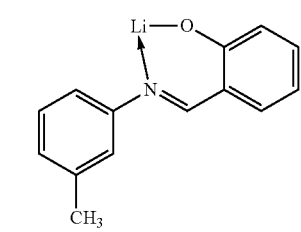
102

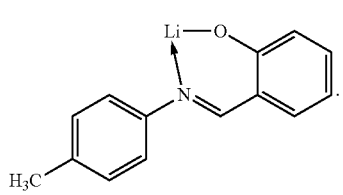
103

According to various embodiments of the OLED of the present invention the organic ligand of the lithium organic complex is a quinolate, a borate, a phenolate, a pyridinolate or a Schiff base ligand;

preferably the lithium quinolate complex has the formula I, II or III:

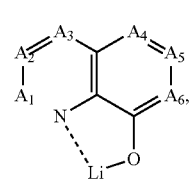
(I)

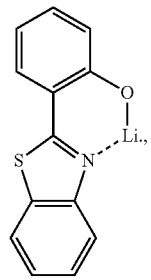
(II)

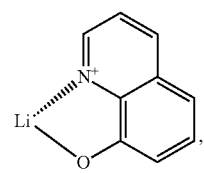
(III)

wherein
A1 to A6 are same or independently selected from CH, CR, N, O;
R is same or independently selected from hydrogen, halogen, alkyl or aryl or heteroaryl with 1 to 20 carbon atoms; and more preferred A1 to A6 are CH;
preferably the borate based organic ligand is a tetra(1H-pyrazol-1-yl)borate;
preferably the phenolate is a 2-(pyridin-2-yl)phenolate, a 2-(diphenylphosphoryl)phenolate, an imidazol phenolates, or 2-(pyridin-2-yl)phenolate and more preferred 2-(1-phenyl-1H-benzo[d]imidazol-2-yl)phenolate;
preferably the pyridinolate is a 2-(diphenylphosphoryl)pyridin-3-olate,
preferably the lithium Schiff base has the structure 100, 101, 102 or 103:

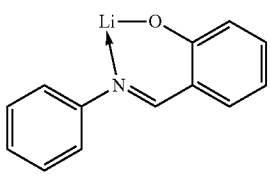
100

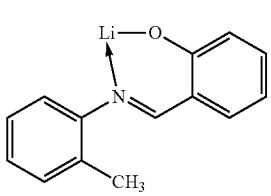
101

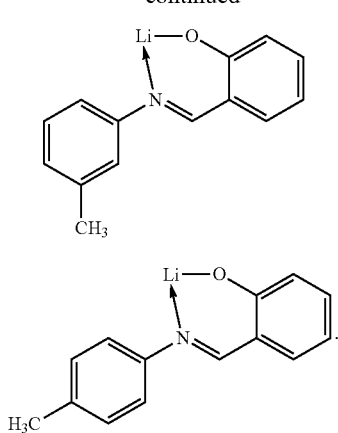

According to various embodiments of the OLED of the present invention the first electron transport layer and the second electron transport layer may comprises at least one matrix compound.

According to various embodiments of the OLED of the present invention the first electron transport layer and the second electron transport layer comprises at least one matrix compound, whereby the matrix compound class of the first electron transport layer and the second electron transport layer are selected same or different, preferably the same According to various embodiments of the OLED of the present invention the first electron transport layer and the second electron transport layer comprises at least one matrix compound, whereby the matrix compound of the first electron transport layer and the second electron transport layer are selected same or different, preferably the same.

According to various embodiments of the OLED the matrix compound of the first electron transport layer and the second electron transport layer, preferably the matrix compound of the first and second electron transport layer can be same, may be selected from:
- an anthracene based compound or a hetero substituted anthracene based compound, preferably 2-(4-(9,10-di(naphthalen-2-yl)anthracene-2-yl)phenyl)-1-phenyl-1H-benzo[d]imidazole and/or N4,N4''-di(naphthalen-1-yl)-N4,N4''-diphenyl-[1,1':4',1''-terphenyl]-4,4''-diamine;
- a phosphine oxide based compound, preferably (3-(dibenzo[c,h]acridin-7-yl)phenyl)diphenylphosphine oxide and/or phenyl bis(3-(pyren-1-yl)phenyl)phosphine oxide and/or 3-Phenyl-3H-benzo[b]dinaphtho[2,1-d:1',2'-f]phosphepine-3-oxide; or
- a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline; or wherein the first electron transport layer and the second electron transport layer comprises at least one matrix compound, wherein the matrix compound is selected from:
- a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide; or
- a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline; and
free of an anthracene based compound and free of a hetero substituted anthracene based compound.

According to various embodiments of the OLED the matrix compound of the first electron transport layer and the second electron transport layer may be selected from:
- a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide; or
- a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline; and
free of an anthracene based compound and free of a hetero substituted anthracene based compound.

According to various embodiments of the OLED the matrix compound of the first electron transport layer and the second electron transport layer may be selected from:
- a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide; and
free of an anthracene based compound and free of a hetero substituted anthracene based compound.

According to various embodiments of the OLED the matrix compound of the first electron transport layer and the second electron transport layer may be selected from:
- a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline; and
free of an anthracene based compound and free of a hetero substituted anthracene based compound.

According to various embodiments of the OLED the matrix compound of the first electron transport layer and the second electron transport layer are the same and may be selected from:
- a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide; or
- a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline; and
free of an anthracene based compound and free of a hetero substituted anthracene based compound.

According to various embodiments of the OLED the matrix compound of the first electron transport layer and the second electron transport layer are the same and may be selected from:
- a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide; and
free of an anthracene based compound and free of a hetero substituted anthracene based compound.

According to various embodiments of the OLED the matrix compound of the first electron transport layer and the second electron transport layer are the same and may be selected from:

a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline; and free of an anthracene based compound and free of a hetero substituted anthracene based compound.

According to various embodiments of the OLED of the present invention the thicknesses of the first electron transport layer and the second electron transport layer may be the same or may be each independently in the range of about ≥0.5 nm to about ≤95 nm, preferably of about ≥3 nm to about ≤80 nm, further preferred of about ≥5 nm to about ≤60 nm, also preferred of about ≥6 nm to about ≤40 nm, in addition preferred about ≥8 nm to about ≤20 nm and more preferred of about ≥10 nm to about ≤18 nm.

According to various embodiments of the OLED of the present invention the electron transport layer stack the thicknesses of the electron transport layer stack can be in the range of about ≥25 nm to about ≤100 nm, preferably of about ≥30 nm to about ≤80 nm, further preferred of about ≥35 nm to about ≤60 nm, and more preferred of about ≥36 nm to about ≤40 nm.

According to various embodiments of the OLED of the present invention the electron transport layer stack has 2 to 4 electron transport layers and more preferred 2 electron transport layers.

According to various embodiments of the OLED of the present invention the second electron transport layer can be formed directly on the first electron transport layer.

According to various embodiments of the OLED of the present invention:

the first electron transport layer comprises:
a) about ≥10 wt.-% to about ≤70 wt.-%, preferably about ≥20 wt.-% to about ≤65 wt.-% and also preferred about ≥50 wt.-% to about ≤60 wt.-% of a lithium halide or an lithium organic complex of a lithium quinolate, a lithium borate, a lithium phenolate and/or a lithium Schiff base, preferably of a lithium quinolate complex has the formula I, II or III:

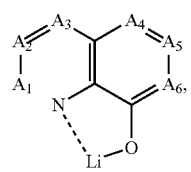

(I)

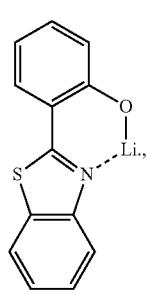

(II)

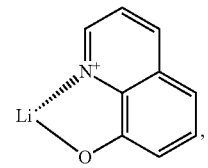

(III)

wherein
A1 to A6 are same or independently selected from CH, CR, N, O,
R is same or independently selected from hydrogen, halogen, alkyl or aryl or heteroaryl with 1 to 20 carbon atoms, and more preferred of a lithium 8-hydroxyquinolate;

b) about ≤90 wt.-% to about ≥30 wt.-%, preferably about ≤80 wt.-% to about ≥35 wt.-% and also preferred about ≤50 wt.-% to about ≥40 wt.-% of a matrix compound of:
an anthracene based compound or a hetero substituted anthracene based compound, preferably 2-(4-(9,10-di(naphthalen-2-yl)anthracene-2-yl)phenyl)-1-phenyl-1H-benzo[d]imidazole and/or N4,N4"-di(naphthalen-1-yl)-N4,N4"-diphenyl-[1,1':4',1"-terphenyl]-4,4"-diamine; or a phosphine oxide based compound, preferably (3-(dibenzo[c,h]acridin-7-yl)phenyl)diphenylphosphine oxide and/or phenyl bis(3-(pyren-1-yl)phenyl) phosphine oxide and/or 3-Phenyl-3H-benzo[b]dinaphtho[2,1-d:1',2'-f]phosphepine-3-oxide; or a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline;
whereby
more preferred is a phosphine oxide based compound and most preferred is (3-(dibenzo[c,h]acridin-7-yl)phenyl) diphenylphosphine oxide;

the second electron transport layer comprises:
c) about ≥10 wt.-% to about ≤70 wt.-%, preferably about ≥20 wt.-% to about ≤65 wt.-% and also preferred about ≥50 wt.-% to about ≤60 wt.-% of a lithium halide or an lithium organic complex of a lithium quinolate, preferably of a lithium quinolate having the formula I, II or III, a lithium borate, a lithium phenolate and/or a lithium Schiff base, more preferred of a lithium borate based organic ligand and most preferred of a lithium tetra(1H-pyrazol-1-yl)borate;

d) about ≤90 wt.-% to about ≥30 wt.-%, preferably about ≤80 wt.-% to about ≥35 wt.-% and also preferred about ≤50 wt.-% to about ≥40 wt.-% of a matrix compound of:
an anthracene based compound or a hetero substituted anthracene based compound, preferably 2-(4-(9,10-di(naphthalen-2-yl)anthracene-2-yl)phenyl)-1-phenyl-1H-benzo[d]imidazole and/or N4,N4"-di(naphthalen-1-yl)-N4,N4"-diphenyl-[1,1':4',1"-terphenyl]-4,4"-diamine; or a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide; or a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline;
whereby
more preferred is a phosphine oxide based compound and most preferred is (3-(dibenzo[c,h]acridin-7-yl)phenyl) diphenylphosphine oxide; whereby the lithium organic complex a) of the first electron transport layer is not the same as the lithium organic complex c) of the second electron transport layer; and the lithium halide a) of the first electron transport layer is not the same as the lithium halide c) of the second electron transport layer; and the wt.-% of the components of the first electron transport layer are selected such that the total wt.-% amount does not exceed 100 wt.-% and the wt.-% of the components of the second electron transport layer are selected such that the total wt.-% amount does not exceed 100 wt.-%, and the wt.-% of the components of the first electron transport layer are based on the total weight of the first electron transport layer and the wt.-% of the components of the second electron transport layer are based on the total weight of the second electron transport layer.

According to one embodiment of the OLED, the first electron transport layer comprises of about ≥50 wt.-% to about ≤60 wt.-% of a first lithium halide or a first lithium organic complex and about ≤50 wt.-% to about ≥40 wt.-% of a matrix compound of:
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f] phosphepine-3-oxide and/or phenyl bis(3-(pyren-1-yl) phenyl)phosphine oxide; or
  a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline; and
the second electron transport layer comprises of about ≥10 wt.-% to about ≤30 wt.-% of a second lithium halide or a second lithium organic complex and about ≤90 wt.-% to about ≥70 wt.-% of a matrix compound of:
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f] phosphepine-3-oxide and/or phenyl bis(3-(pyren-1-yl) phenyl)phosphine oxide; or
  a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline.

According to one embodiment of the OLED, the first electron transport layer comprises of about ≥50 wt.-% to about ≤60 wt.-% of a first lithium halide or a first lithium organic complex and about ≤50 wt.-% to about ≥40 wt.-% of a matrix compound of:
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f] phosphepine-3-oxide and/or phenyl bis(3-(pyren-1-yl) phenyl)phosphine oxide; or
  a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline;
wherein the matrix compound of the first and second electron transport layer are the same.

According to one embodiment of the OLED, the first electron transport layer comprises of about ≥50 wt.-% to about ≤60 wt.-% of a first lithium halide or a first lithium organic complex and about ≤50 wt.-% to about ≥40 wt.-% of a matrix compound of:
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f] phosphepine-3-oxide and/or phenyl bis(3-(pyren-1-yl) phenyl)phosphine oxide; and
the second electron transport layer comprises of about ≥10 wt.-% to about ≤30 wt.-% of a second lithium halide or a second lithium organic complex and about ≤90 wt.-% to about ≥70 wt.-% of a matrix compound of:
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f] phosphepine-3-oxide and/or phenyl bis(3-(pyren-1-yl) phenyl)phosphine oxide.

According to one embodiment of the OLED, the first electron transport layer comprises of about ≥50 wt.-% to about ≤60 wt.-% of a first lithium halide or a first lithium organic complex and about ≤50 wt.-% to about ≥40 wt.-% of a matrix compound of:
  a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline; and
the second electron transport layer comprises of about ≥10 wt.-% to about ≤30 wt.-% of a second lithium halide or a second lithium organic complex and about ≤90 wt.-% to about ≥70 wt.-% of a matrix compound of:
  a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline.

According to one embodiment of the OLED, the first electron transport layer comprises of about ≥50 wt.-% to about ≤60 wt.-% of a first lithium halide or a first lithium organic complex and about ≤50 wt.-% to about ≥40 wt.-% of a matrix compound of:
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f] phosphepine-3-oxide and/or phenyl bis(3-(pyren-1-yl) phenyl)phosphine oxide; and
the second electron transport layer comprises of about ≥10 wt.-% to about ≤30 wt.-% of a second lithium halide or a second lithium organic complex and about ≤90 wt.-% to about ≥70 wt.-% of a matrix compound of:
  a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f] phosphepine-3-oxide and/or phenyl bis(3-(pyren-1-yl) phenyl)phosphine oxide;
wherein the matrix compound of the first and second electron transport layer are the same.

According to one embodiment of the OLED, the first electron transport layer comprises of about ≥50 wt.-% to about ≤60 wt.-% of a first lithium halide or a first lithium organic complex and about ≤50 wt.-% to about ≥40 wt.-% of a matrix compound of:
  a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline; and the second electron transport layer comprises of about ≥10 wt.-% to about ≤30 wt.-% of a second lithium halide or a second lithium organic complex and about ≤90 wt.-% to about ≥70 wt.-% of a matrix compound of:

a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline;

wherein the matrix compound of the first and second electron transport layer are the same.

According to various embodiments of the OLED of the present invention:

the first electron transport layer comprises of about ≥50 wt.-% to about ≤60 wt.-% of a lithium 8-hydroxyquinolate and about ≤50 wt.-% to about ≥40 wt.-% of a (3-(dibenzo[c,h]acridin-7-yl)phenyl)diphenylphosphine oxide; and the second electron transport layer comprises of about ≥10 wt.-% to about ≤30 wt.-% of a lithium tetra(1H-pyrazol-1-yl)borate and about ≤90 wt.-% to about ≥70 wt.-% of a (3-(dibenzo[c,h]acridin-7-yl)phenyl)diphenylphosphine oxide.

The light-emitting diode (OLED) comprises at least two electrodes, a first anode electrode and a second cathode electrode.

The electron transport layer/s or electron transport layer stack is not an electrode. The electron transport layer/s or electron transport layer are sandwiched between two electrodes, namely sandwiched between a first anode and a second cathode.

According to another aspect of the present invention, there is provided an organic light-emitting diode (OLED) comprising: a substrate; a first anode electrode formed on the substrate; a second cathode electrode; and an electron transport layer stack formed between the first anode electrode and the second cathode electrode, wherein the electron transport layer stack comprises or consists of at least two electron transport layers.

According to various embodiments, the OLED may further include at least one layer selected from the group consisting of a hole injection layer, a hole transport layer, an emission layer, and a hole blocking layer, formed between the first anode electrode and the electron transport layer.

According to another aspect of the present invention, there is provided an organic light-emitting diode (OLED) comprising: at least one layer selected from the group consisting of a hole injection layer, a hole transport layer, an emission layer, and a hole blocking layer, formed between the first anode electrode and the electron transport layer stack.

According to various embodiments of the present invention, there is provided an organic light-emitting diode (OLED) further comprising an electron injection layer formed between the electron transport layer and the second cathode electrode.

According to various embodiments of the OLED of the present invention, the OLED may not comprises an electron injection layer.

According to another aspect of the present invention, there is provided a method of manufacturing an organic light-emitting diode (OLED), the method using:

at least one deposition source, preferably two deposition sources and more preferred at least three deposition sources; and/or deposition via vacuum thermal evaporation; and/or deposition via solution processing, preferably the processing is selected from spin-coating, printing, casting and/or slot-die coating.

According to various embodiments of the present invention, there is provided a method using:

a first deposition source to release the matrix compound, and a second deposition source to release the lithium halide or lithium organic complex;

the method comprising the steps of forming the electron transport layer stack;

whereby for an organic light-emitting diode (OLED)

the first electron transport layer is formed by releasing the matrix compound from the first deposition source and the first lithium halide or lithium organic complex from the second deposition source;

onto the first electron transport layer the second electron transport layer is formed by releasing the matrix compound from a third deposition source and the second lithium halide or second lithium organic complex from the forth deposition source;

whereby the first lithium organic complex is not the same as the second lithium organic complex; and whereby the first lithium halide is not the same as the second lithium halide, and in case the matrix compound of the first electron transport layer is the same of the second electron transport layer the deposition source is preferably the same.

According to various embodiments of the present invention, the method may further include forming on the first anode electrode an emission layer and at least one layer selected from the group consisting of forming a hole injection layer, forming a hole transport layer, or forming a hole blocking layer, between the first anode electrode and the electron transport layer stack.

According to various embodiments of the present invention, the method may further include the steps for forming an organic light-emitting diode (OLED), wherein on a substrate a first anode electrode is formed, on the first anode electrode an emission layer is formed, on the emission layer an electron transport layer stack is formed, preferably the first electron transport layer is formed on the emission layer and the second electron transport layer is formed directly on the first electron transport layer, on the electron transport layer stack a second cathode electrode is formed, optional a hole injection layer, a hole transport layer, and a hole blocking layer, formed in that order between the first anode electrode and the emission layer, optional an electron injection layer is formed between the electron transport layer and the second cathode electrode.

According to various embodiments of the present invention, the method may further include forming an electron injection layer on the electron transport layer stack. However, according to various embodiments of the OLED of the present invention, the OLED may not comprise an electron injection layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
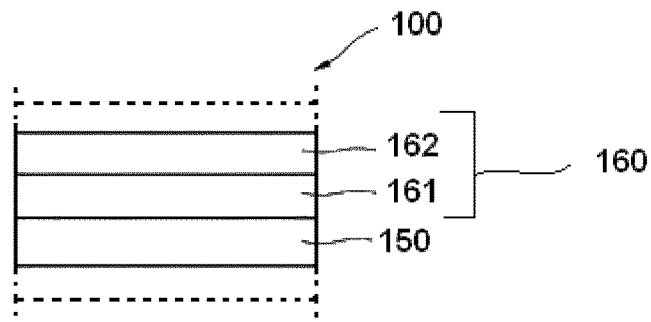
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes an emission layer 150 and an electron transport layer stack (ETL) 160 comprising a first electron transport layer 161 and a second electron transport layer 162, whereby the second electron transport layer 162 is disposed directly on the first electron transport layer 161.

Figure 2:
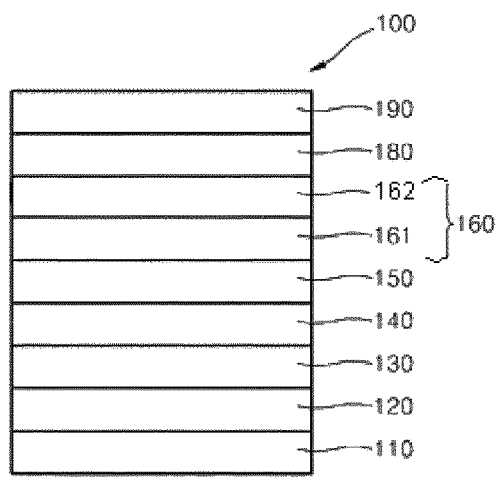
FIG. 2 is a schematic sectional view of an OLED, according to an exemplary embodiment of the present invention.

FIG. 2 is a schematic sectional view of an organic light-emitting diode (OLED) 100, according to an exemplary embodiment of the present invention. The OLED 100 includes a substrate 110, a first electrode 120, a hole injection layer (HIL) 130, a hole transport layer (HTL) 140, an emission layer (EML) 150, an electron transport layer (ETL) 160, an electron injection layer (EIL) 180, and a second electrode 190. The electron transport layer (ETL) 160 includes a first electron transport layer 161 including a matrix material and a first lithium halide or a first lithium organic complex and a second electron transport layer 162 including a matrix material and a second lithium halide or a second lithium organic complex, wherein the second lithium halide or the second lithium organic complex is not the same as the first lithium halide or the first lithium organic complex. The second electron transport layer 162 is directly formed on the first electron transport layer 161. The first layer 161 may be formed directly on the EML 150.

The substrate 110 may be any substrate that is commonly used in manufacturing of organic light-emitting diodes. If light is emitted through the substrate, the substrate 110 may be a transparent material, for example a glass substrate or a transparent plastic substrate, having excellent mechanical strength, thermal stability, transparency, surface smoothness, ease of handling, and waterproofness. If light is emitted through the top surface, the substrate 110 may be a transparent or non-transparent material, for example a glass substrate, a plastic substrate, a metal substrate or a silicon substrate.

The first anode electrode 120 may be formed by depositing or sputtering a compound that is used to form the first anode electrode 120. The compound used to form the first anode electrode 120 may be a high work-function compound, so as to facilitate hole injection. If a p-doped HIL is used, the anode material may also be selected from a low work function material (i.e. Aluminum). The first anode electrode 120 may be a transparent or reflective electrode. Transparent conductive compounds, such as indium tin oxide (ITO), indium zinc oxide (IZO), tin-dioxide ($SnO_2$), and zinc oxide (ZnO), may be used to form the first anode electrode 120. The first anode electrode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

The HIL 130 may be formed on the first anode electrode 120 by vacuum deposition, spin coating, printing, casting, slot-die coating, Langmuir-Blodgett (LB) deposition, or the like. When the HIL 130 is formed using vacuum deposition, the deposition conditions may vary according to the compound that is used to form the HIL 130, and the desired structure and thermal properties of the HIL 130. In general, however, conditions for vacuum deposition may include a deposition temperature of 100° C. to 500° C., a pressure of $10^{-8}$ to $10^{-3}$ torr (1 torr equals 133.322 Pa), and a deposition rate of 0.1 to 10 nm/sec.

When the HIL 130 is formed using spin coating, printing, coating conditions may vary according to a compound that is used to form the HIL 130, and the desired structure and thermal properties of the HIL 130. For example, the coating conditions may include a coating speed of about 2000 rpm to about 5000 rpm, and a thermal treatment temperature of about 80° C. to about 200° C. Thermal treatment removes a solvent after the coating is performed.

The HIL 130 may be formed of any compound that is commonly used to form an HIL. Examples of compounds that may be used to form the HIL 130 include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline)/poly(4-styrenesulfonate (PANI/PSS).

The HIL 130 may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N-bis(phenyl)-benzidine) doped with F4TCNQ. α-NPD doped with 2,2'-(perfluoronaphthalene-2,6-diylidene) dimalononitrile (PD1). α-NPD doped with 2,2',2"-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

The thickness of the HIL 130 may be in the range of about 1 nm to about 100 nm, and for example, about 1 nm to about 25 nm. When the thickness of the HIL 130 is within this range, the HIL 130 may have excellent hole injecting characteristics, without a substantial increase in driving voltage.

The hole transport layer (HTL) 140 may be formed on the HIL 130 by vacuum deposition, spin coating, slot-die coating, printing, casting, Langmuir-Blodgett (LB) deposition, or the like. When the HTL 140 is formed by vacuum deposition or spin coating, the conditions for deposition and coating may be similar to those for the formation of the HIL 130. However, the conditions for the vacuum or solution deposition may vary, according to the compound that is used to form the HTL 140.

The HTL 140 may be formed of any compound that is commonly used to form a HTL. Compound that can be suitably used is disclosed for example in Yasuhiko Shirota and Hiroshi Kageyama, Chem. Rev. 2007, 107, 953-1010 an incorporated by reference. Examples of the compound that may be used to form the HTL 140 are: a carbazole derivative, such as N-phenylcarbazole or polyvinylcarbazole; an amine derivative having an aromatic condensation ring, such as N,N'-bis(3-methylphenyl)-N,N-diphenyl-[1,1-biphenyl]-4,4'-diamine (TPD), or N,N'-di(naphthalene-1-yl)-N,N'-diphenyl benzydine (alpha-NPD); and a triphenylamine-based compound, such as 4,4',4"-tris(N-carbazolyl)triphenylamine (TCTA). Among these compounds, TCTA can transport holes and inhibit excitons from being diffused into the EML.

The thickness of the HTL 140 may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL 140 may be 170 nm to 200 nm.

When the thickness of the HTL 140 is within this range, the HTL 140 may have excellent hole transporting characteristics, without a substantial increase in driving voltage.

The EML 150 may be formed on the HTL 140 by vacuum deposition, spin coating, slot-die coating, printing, casting, LB, or the like. When the EML 150 is formed using vacuum deposition or spin coating, the conditions for deposition and coating may be similar to those for the formation of the HIL 130. However, the conditions for deposition and coating may vary, according to the compound that is used to form the EML 150.

The emission layer (EML) 150 may be formed of a combination of a host and a dopant. Example of the host are Alq3, 4,4'-N,N'-dicarbazole-biphenyl (CBP), poly(n-vinylcarbazole) (PVK), 9,10-di(naphthalene-2-yl)anthracenee (ADN), TCTA, 1,3,5-tris(N-phenylbenzimidazole-2-yl)benzene (TPBI), 3-tert-butyl-9,10-di-2-naphthylanthracenee (TBADN), distyrylarylene (DSA), Bis(2-(2-hydroxyphenyl)benzothiazolate)zinc (Zn(BTZ) 2), E3 below, AND, Compound 1 below, and Compound 2 below.

E3

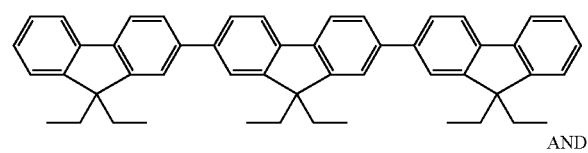

AND

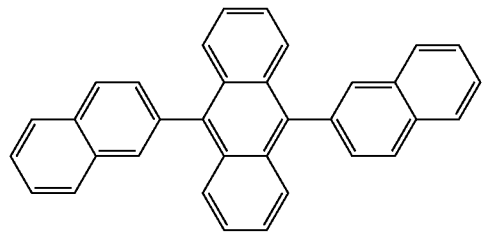

Compound 1

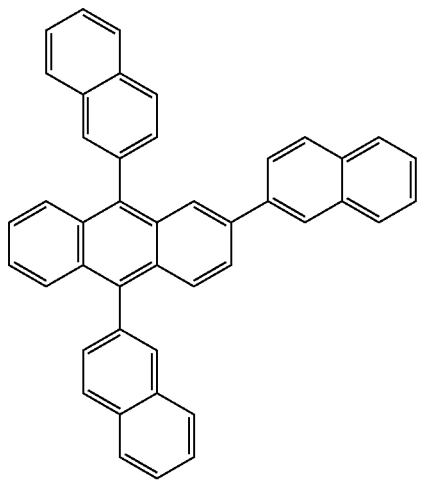

Compound 2

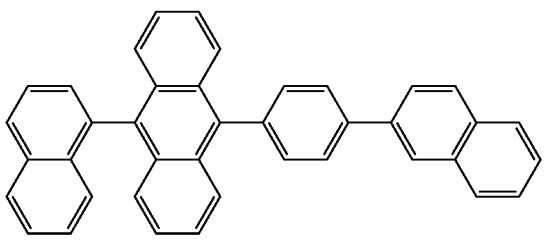

The dopant may be a phosphorescent or fluorescent emitter. Phosphorescent emitters are preferred due to their higher efficiency Examples of a red dopant are PtOEP, Ir(piq) 3, and Btp 2Ir(acac), but are not limited thereto. These compounds are phosphorescent emitters, however, fluorescent red dopants could also be used.

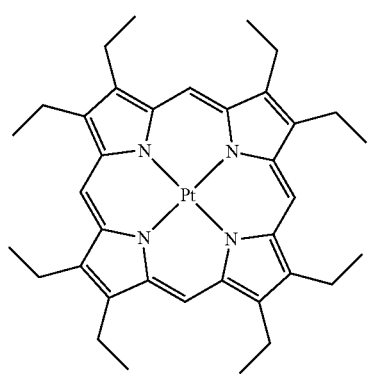

PtOEP

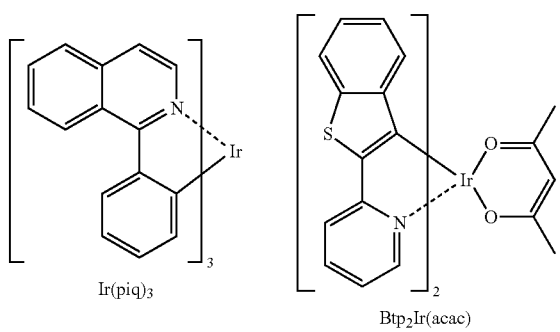

Ir(piq)3

Btp2Ir(acac)

Examples of a phosphorescent green dopant are Ir(ppy) 3 (ppy=phenylpyridine), Ir(ppy) 2(acac), Ir(mpyp) 3 are shown below. Compound 3 is an example of a fluorescent green emitter and the structure is shown below.

Examples of a phosphorescent blue dopant are $F_2$Irpic, $(F_2ppy)_2$Ir(tmd) and Ir(dfppz) 3, ter-fluorene, the structures are shown below. 4.4'-bis(4-diphenyl amiostyryl)biphenyl (DPAVBi), 2,5,8,11-tetra-tert-butyl perylene (TBPe), and Compound 4 below are examples of fluorescent blue dopants.

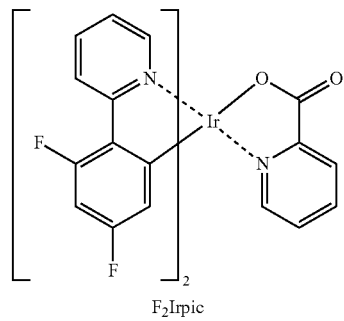

$F_2$Irpic

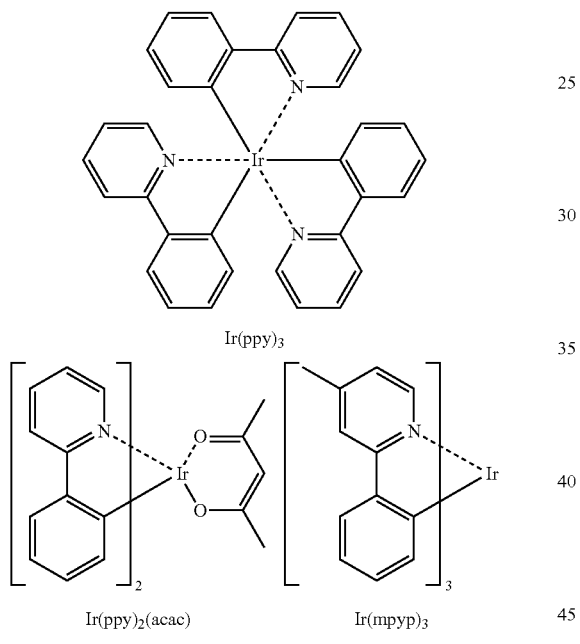

Ir(ppy)3

Ir(ppy)2(acac)   Ir(mpyp)3

Compound 3

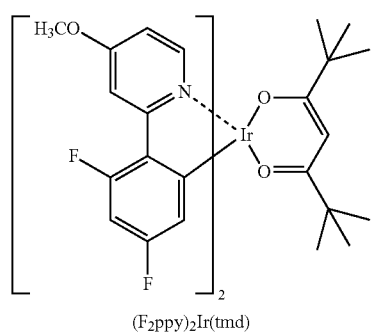

$(F_2ppy)_2$Ir(tmd)

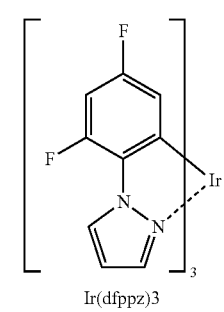

Ir(dfppz)3

Compound 4

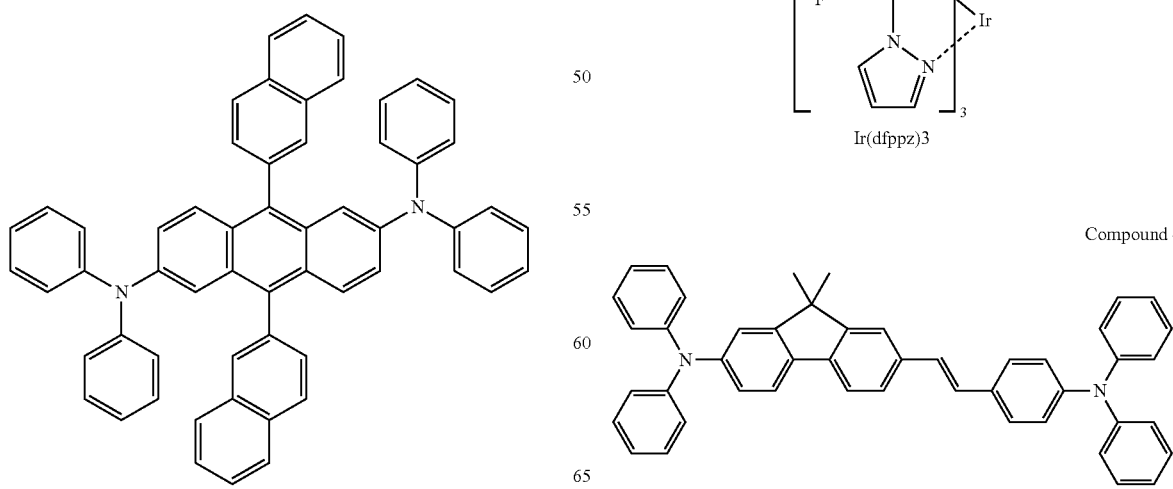

The amount of the dopant may be in the range of about 0.01 to about 50 parts by weight, based on 100 parts by weight of the host. The EML 150 may have a thickness of about 10 nm to about 100 nm, for example, about 20 nm to about 60 nm. When the thickness of the EML 150 is within this range, the EML 150 may have excellent light emission, without a substantial increase in driving voltage.

When the EML 150 comprises a phosphorescent dopant, a hole blocking layer (HBL) (not shown) may be formed on the EML 150, by using vacuum deposition, spin coating, slot-die coating, printing, casting, LB deposition, or the like, in order to prevent the diffusion of triplet excitons or holes into the ETL 160. When the HBL is formed using vacuum deposition or spin coating, the conditions for deposition and coating may be similar to those for the formation of the HIL 130. However, the conditions for deposition and coating may vary, according to the compound that is used to form the HBL. Any compound that is commonly used to form a HBL may be used. Examples of compounds for forming the HBL include an oxadiazole derivative, a triazole derivative, and a phenanthroline derivative.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

The ETL 160 may be formed on the EML 150 or on the HBL if the HBL is formed. The ETL 160 includes a first layer 161 including a first lithium halide or a first lithium organic complex; and a second electron transport layer 162 including a second lithium halide or a second lithium organic complex, wherein the first lithium organic complex is not the same as the second lithium organic complex and wherein the first lithium halide is not the same as the second lithium halide.

The ETL 160 has a stacked structure, preferably of two ETL-layers (161/162), so that injection and transport of electrons may be balanced and holes may be efficiently blocked. In a conventional OLED, since the amounts of electrons and holes vary with time, after driving is initiated, the number of excitons generated in an emission area may be reduced. As a result, a carrier balance may not be maintained, so as to reduce the lifetime of the OLED.

However, in the ETL 160, the first layer 161 and the second layer 162 have similar or identical energy levels, so that the carrier balance may be uniformly maintained, while controlling the electron-transfer rate. Thus, the lifetime characteristics of the OLED 100 are improved.

In general the matrix compound for the first electron layer 161 and second electron layer can be identical or different.

Matrix compound for the first electron layer 161 and second electron layer that can be suitable used are selected from the group comprising anthracen compounds, preferably 2-(4-(9,10-di(naphthalen-2-yl)anthracen-2-yl)phenyl)-1-phenyl-1H-benzo[d]imidazole Anthracene compounds that can be used as matrix materials are disclosed in U.S. Pat. No. 6,878,469 B and incorporated by reference.

Other matrix compounds that can be used are diphenylphosphine oxide, preferably (3-(dibenzo[c,h]acridin-7-yl)phenyl)diphenylphosphine oxide, phenylbis(3-(pyren-1-yl)phenyl)phosphine oxide, 3-phenyl-3H-benzo[b]dinaphtho[2,1-d:1',2'-f]phosphepine-3-oxide, phenyldi(pyren-1-yl)phosphine oxide.

Diphenylphosphine oxide compounds that can be used as matrix materials are disclosed in EP 2395571 A1, WO2013079217 A1, EP 13187905, EP13199361 and JP2002063989 A1, incorporated by reference.

Other suitable matrix compounds that can be used are phenanthroline compounds, preferably selected from the group comprising of 2,4,7,9-tetraphenyl-1,10-phenanthroline, 4,7-diphenyl-2,9-di-p-tolyl-1,10-phenanthroline, and 2,9-di(biphenyl-4-yl)-4,7-diphenyl-1,10-phenanthroline. Phenanthroline compounds that can be used as matrix materials are disclosed in EP 1786050 A1 and incorporated by reference.

The matrix compound of the first electron layer 161 and/or second electron transport layer may be a compound that efficiently transports electrons, such as an anthracene-based compound, diphenylphosphine oxide based compound, or a phenanthroline based compound, preferably a matrix compound mentioned in Table 1. For example, the matrix compound of the first electron layer 161 and/or second electron transport layer may be selected from the group consisting of Compound 5, a compound represented by Formula 2, and a compound represented by Formula 3 below:

Compound 5

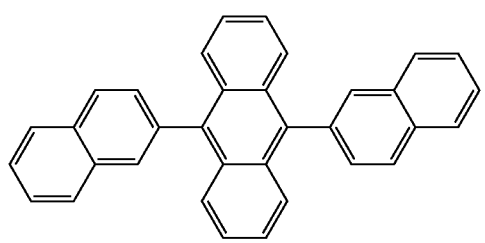

-continued

Formula 2

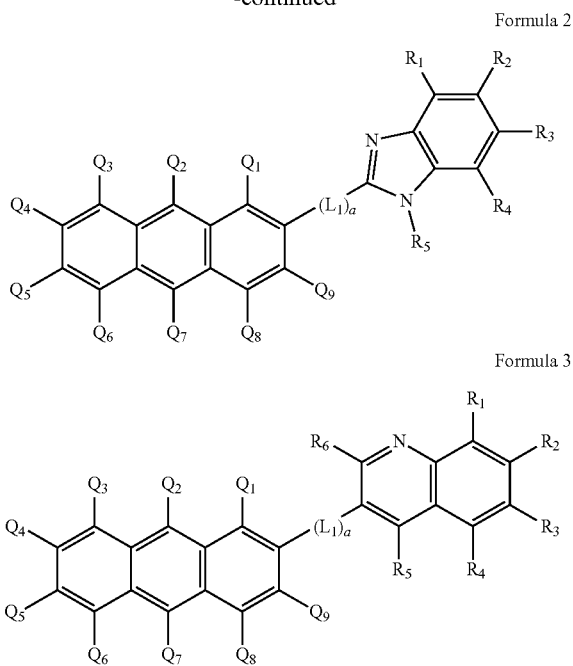

Formula 3

In Formulae 2 and 3, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group. At least two adjacent $R_1$ to $R_6$ groups are optionally bonded to each other, to form a saturated or unsaturated ring. $L_1$ is a bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ hetero arylene group. $Q_1$ through $Q_9$ are each independently a hydrogen atom, a substituted or unsubstituted $C_6$-$C_{30}$ aryl group, or a substituted or unsubstituted $C_3$-$C_{30}$ hetero aryl group, and "a" is an integer from 1 to 10.

For example, $R_1$ to $R_6$ may be each independently selected from the group consisting of a hydrogen atom, a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group.

In particular, in Formula 2 and/or 3, $R_1$ to $R_4$ may each be a hydrogen atom, $R_5$ may be selected from the group consisting of a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group. In addition, in Formula 3, $R_1$ to $R_6$ may each be a hydrogen atom.

For example, in Formula 2 and/or 3, $Q_1$ to $Q_9$ are each independently a hydrogen atom, a phenyl group, a naphthyl group, an anthryl group, a pyridinyl group, and a pyrazinyl group. In particular, in Formulae 2 and/or 3, $Q_1$, $Q_3$-$Q_6$, $Q_8$ and $Q_9$ are hydrogen atoms, and $Q_2$ and $Q_7$ may be each independently selected from the group consisting of a phenyl group, a naphthyl group, an anthryl group, a pyridinyl group, and a pyrazinyl group.

For example, $L_1$, in Formula 2 and/or 3, may be selected from the group consisting of a phenylene group, a naphthylene group, an anthrylene group, a pyridinylene group, and a pyrazinylene group. In particular, $L_1$ may be a phenylene group or a pyridinylene group. For example, "a" may be 1, 2, or 3.

The matrix compound may be further selected from Compound 5, 6, or 7 below:

Compound 6

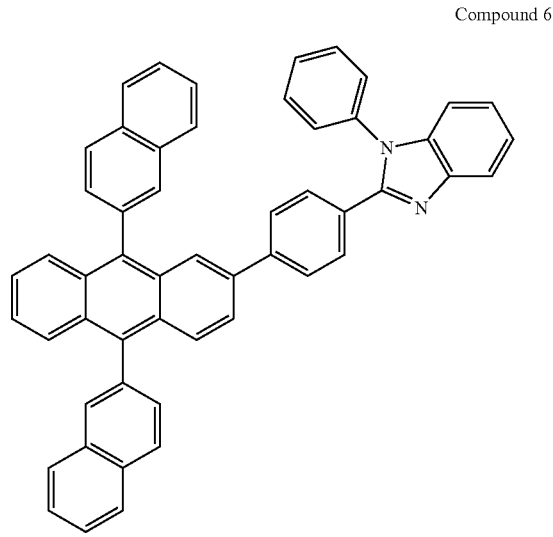

Compound 7

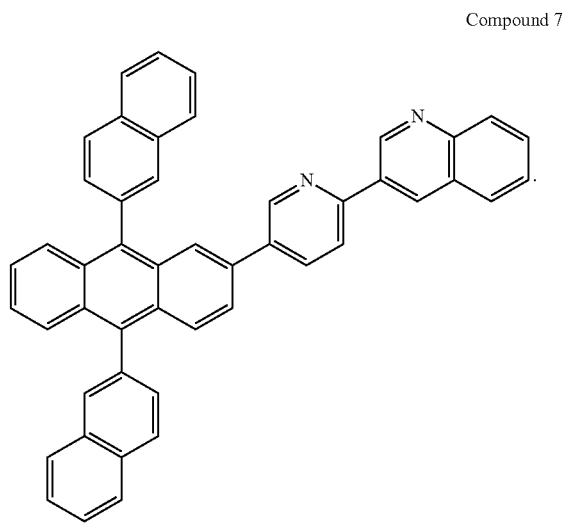

TABLE 1

| Internal name | IUPAC name | Structure | Reference |
|---|---|---|---|
| MX 1 | 2-(4-(9,10-di(naphthalen-2-yl)anthracen-2-yl)phenyl)-1-phenyl-1H-benzo[d]imidazole | | U.S. Pat. No. 6,878,469 B2. |
| MX 2 | (3-(dibenzo[c,h]acridin-7-yl)phenyl)diphenylphosphine oxide | | EP 2395571B1, WO2013079217A1 |
| MX 3 | Phenylbis(3-(pyren-1-yl)phenyl)phosphine oxide | | EP13187905.8 |

TABLE 1-continued

Chemical structures of matrix materials that can be suitable used

| Internal name | IUPAC name | Structure | Reference |
|---|---|---|---|
| MX 4 | 3-Phenyl-3H-benzo[b]dinaphtho[2,1-d:1',2'-f]phosphepine-3-oxide | | EP13199361.0 |
| MX 5 | Phenyldi(pyren-1-yl) phosphine oxide | | JP4876333 |
| MX 6 | 2,4,7,9-tetraphenyl-1,10-phenanthroline | | EP1786050 |
| MX 8 | 2,9-di(biphenyl-4-yl)-4,7-diphenyl-1,10-phenanthroline | | EP1786050 |

TABLE 1-continued

Chemical structures of matrix materials that can be suitable used

| Internal name | IUPAC name | Structure | Reference |
|---|---|---|---|
| MX 9 | 4,7-diphenyl-2,9-di-p-tolyl-1,10-phenanthroline | | EP1786050 |

The first and second lithium halide and first and second lithium organic complex may inject electrons and block holes. The first electron transport layer 161 comprises a first lithium halide or a first lithium organic complex; and the second electron transport layer 162 comprises a second lithium halide or a second lithium organic complex, wherein the first lithium organic complex is not the same as the second lithium organic complex and wherein the first lithium halide is not the same as the second lithium halide.

Suitable organic ligands to form a lithium organic complex that can be used for the first electron transport layer or the second electron transport layer are disclosed, and incorporated by reference, for example in US 2014/0048792 and Kathirgamanathan, Poopathy; Arkley, Vincent; Surendrakumar, Sivagnanasundram; Chan, Yun F.; Ravichandran, Seenivasagam; Ganeshamurugan, Subramaniam; Kumaraverl, Muttulingam; Antipan-Lara, Juan; Paramaswara, Gnanamolly; Reddy, Vanga R., Digest of Technical Papers—Society for Information Display International Symposium (2010), 41(Bk. 1), 465-468.

TABLE 2

Lithium organic complex that can be suitable used

| | IUPAC name | Structure | Reference |
|---|---|---|---|
| LiQ | lithium 8-hydroxyquinolate | | WO 2013079217 A1 |
| Li-1 | lithium tetra(1H-pyrazol-1-yl)borate | | WO 2013079676 A1 |
| Li-2 | lithium 2-(diphenylphosphoryl)phenolate | | WO 2013079678A1 |

TABLE 2-continued

Lithium organic complex that can be suitable used

| | IUPAC name | Structure | Reference |
|---|---|---|---|
| Li-3 | lithium 2-(pyridin-2-yl)phenolate | | JP2 008195623 |
| Li-4 | lithium 2-(1-phenyl-1H-benzo[d]imidazol-2-yl)phenolate | | JP 2001291593, |
| Li-5 | lithium 2-(benzo[d]oxazol-2-yl)phenolate | | US 20030165711 |
| Li-6 | lithium 2-(diphenyl-phosphoryl)pyridin-3-olate | | EP 2724388 |

The organic ligand of the lithium organic complex of the first electron transport layer 161 and/or second electron transport layer 162 may be selected from the group comprising a quinolate, a borate, a phenolate, a pyridinolate or a Schiff base ligand, or Table 2, wherein the lithium organic complex of the first electron transport layer 161 is not the same as the lithium organic complex of the second electron transport layer 162;

preferably the lithium quinolate complex has the formula I:

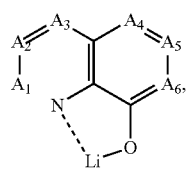

(I)

wherein
A1 to A6 are same or independently selected from CH, CR, N, O;
R is same or independently selected from hydrogen, halogen, alkyl or aryl or heteroaryl with 1 to 20 carbon atoms; and more preferred A1 to A6 are CH;
preferably the borate based organic ligand is a tetra(1H-pyrazol-1-yl)borate;

preferably the phenolate is a 2-(pyridin-2-yl)phenolate or a 2-(diphenylphosphoryl)phenolate;

preferably the lithium Schiff base has the structure 100, 101, 102 or 103:

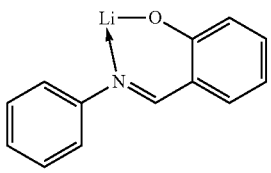

100

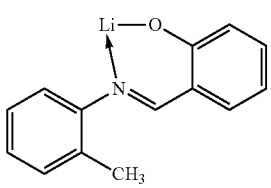

101

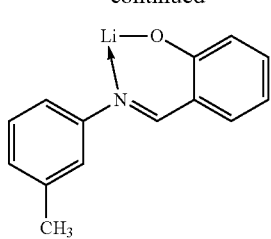

102

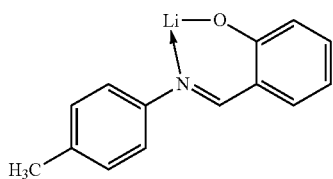

103 more preferred the lithium organic complex is selected from a compound of Table 2. The lithium halide of the first electron transport layer 161 and/or second electron transport layer 162 may be selected from the group comprising a LiF, LiCl, LiBr or LiJ, and preferably LiF.

The ETL layer stack thickness can be adjusted such that the light out coupling is maximized. Further ETL layer stack thickness can be adjusted for the desired color tuning, for example to achieve a deeper shade of blue. i.e. smaller CIEy.

The thicknesses of the first electron transport layer 161 and/or second electron transport layer 162 may be the same or each independently in the in the range of about ≥0.5 nm to about ≤95 nm, preferably of about ≥3 nm to about ≤80 nm, further preferred of about ≥5 nm to about ≤60 nm, also preferred of about ≥6 nm to about ≤40 nm, in addition preferred about ≥8 nm to about ≤20 nm and more preferred of about ≥10 nm to about ≤18 nm.

When the thicknesses of the first electron transport layer 161 and second electron transport layer 162 within this range, preferably of about ≥10 nm to about ≤18 nm, the electron transport layer 160 may effectively inject and transport electrons, without a substantial increase in driving voltage.

For blue emitting OLEDs, the thickness of the ETL layer stack is 10 to 50 nm, preferably 30 to 40 nm. For red and green emitting OLEDs, the thickness of ETLs is 20 to 100 nm, preferably 20-100 nm and more preferably 30-80 nm. The thickness is selected so as to maximize efficiency of light emission.

The amount of the lithium organic complex in the first electron transport layer 161 may be in the range of about ≥10 wt.-% to about ≤70 wt.-%, preferably about ≥20 wt.-% to about ≤65 wt.-% and also preferred about ≥50 wt.-% to about ≤60 wt.-%, by weight of the first electron transport layer 161.

The amount of the lithium organic complex in the second electron transport layer 162 may be in the range of about ≥10 wt.-% to about ≤70 wt.-%, preferably about ≥20 wt.-% to about ≤65 wt.-% and also preferred about ≥50 wt.-% to about ≤60 wt.-%, by weight of the second electron transport layer 162.

The amount of the lithium halide or lithium organic complex in the first electron transport layer 161 may be in the range of about ≥10 mol-% to about ≤95 mol-%, preferably about ≥15 mol-% to about ≤90 mol-% and also preferred about ≥20 mol-% to about ≤80 mol-%, by weight of the first electron transport layer 161.

The amount of the lithium halide or lithium organic complex in the second electron transport layer 162 may be in the range of about ≥10 mol-% to about ≤95 mol-%, preferably about ≥15 mol-% to about ≤90 mol-% and also preferred about ≥20 mol-% to about ≤80 mol-%, by weight of the second electron transport layer 162.

TABLE 3

A comparison of mol-% and wt.-% is shown in the table below

| Compound | wt.-% | mol-% |
|---|---|---|
| MX 2:LiQ | 20 | 48 |
| MX 2:LiQ | 40 | 71 |
| MX 2:LiQ | 50 | 79 |
| MX 2:LiQ | 65 | 87 |
| MX 2:Li-2 | 20 | 32 |
| MX 2:Li-2 | 40 | 55 |
| MX 2:Li-2 | 50 | 65 |
| MX 2:Li-2 | 65 | 77 |
| MX 2:Li-1 | 10 | 18 |
| MX 2:Li-1 | 20 | 33 |
| MX 2:Li-1 | 30 | 45 |
| MX 2:LiF | 20 | 84 |
| MX 2:LiF | 40 | 93 |
| MX 2:LiF | 50 | 96 |
| MX 2:LiF | 65 | 98 |
| MX 1:LiF | 20 | 87 |
| MX 1:LiF | 40 | 95 |
| MX 1:LiF | 50 | 96 |
| MX 1:LiF | 65 | 98 |
| MX 1:LiQ | 20 | 54 |
| MX 1:LiQ | 40 | 76 |
| MX 1:LiQ | 50 | 82 |
| MX 1:LiQ | 65 | 90 |
| MX 4:Li-2 | 20 | 27 |
| MX 4:Li-2 | 40 | 50 |
| MX 4:Li-2 | 50 | 60 |
| MX 4:Li-2 | 60 | 69 |
| MX 4:LiQ | 20 | 43 |
| MX 4:LiQ | 40 | 67 |
| MX 4:LiQ | 50 | 75 |
| MX 4:LiQ | 65 | 85 |
| MX 4:Li-1 | 10 | 15 |
| MX 4:Li-1 | 20 | 28 |
| MX 4:Li-1 | 30 | 40 |

The ETL 160 may be formed on the EML 150 by vacuum deposition, spin coating, slot-die coating, printing, casting, or the like. When the ETL 160 is formed by vacuum deposition or spin coating, the deposition and coating conditions may be similar to those for formation of the HIL 130. However, the deposition and coating conditions may vary, according to a compound that is used to form the ETL 160.

Using vacuum deposition, the first electron transport layer 161 of the ETL 160 may be formed using a first deposition source to deposit a matrix compound, and a second deposition source to deposit a lithium halide or lithium organic complex. The first deposition source and the second deposition source are positioned relative to one another, such that that a mixed deposition region of the first electron transport layer 161 is formed directly on the EML 150.

The second electron transport layer 162 of the ETL 160 may be formed using a first or a third deposition source, for example if the matrix material is different to the ETL 161, and a third or fourth deposition source to deposit a lithium halide or lithium organic complex, whereby the lithium organic complex of the first electron transport layer 161 is not the same as the lithium organic complex of the second electron transport layer 162, and wherein the lithium halide of the first electron transport layer 161 is not the same as the lithium halide of the second electron transport layer 162. The deposition sources are positioned relative to one another, such that a mixed deposition region of the second electron transport layer 162 is formed directly on the first electron transport layer 161.

The stacking process is more simply and quickly performed, as compared to prior methods. In particular, since a plurality of ETL layers may be almost simultaneously deposited in a single chamber, the chamber may not be required to be exhausted after the formation of each layer.

The EIL 180, which facilitates injection of electrons from the cathode, may be formed on the ETL 160, preferably directly on the second electron transport layer 162. Examples of materials for forming the EIL 180 include LiF, NaCl, CsF, Li2O, BaO, Ca, Ba, Yb, Mg which are known in the art. Deposition and coating conditions for forming the EIL 180 are similar to those for formation of the HIL 130, although the deposition and coating conditions may vary, according to a material that is used to form the EIL 180.

The thickness of the EIL 180 may be in the range of about 0.1 nm to 10 nm, for example, in the range of 0.5 nm to 9 nm. When the thickness of the EIL 180 is within this range, the EIL 180 may have satisfactory electron-injecting properties, without a substantial increase in driving voltage.

The second cathode electrode 190 is formed on the EIL 180 if present. The second cathode electrode 190 may be a cathode, which is an electron-injecting electrode. The second electrode 190 may be formed of a metal, an alloy, an electrically conductive compound, or a mixture thereof. The second electrode 190 may have a low work function. For example, the second electrode 190 may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. In addition, the second electrode 190 may be formed of a transparent conductive material, such as ITO or IZO.

The thickness of the cathode electrode 190 may be in the range of about 5 nm to 1000 nm, for example, in the range of 10 nm to 100 nm. When the cathode electrode 190 is in the range of 5 nm to 50 nm, the electrode will transparent even if a metal or metal alloy is used.

Since the layers of the ETL 160 have similar or identical energy levels, the injection and transport of the electrons may be controlled, and the holes may be efficiently blocked. Thus, the OLED 100 may have long lifetime.

Figure 3:
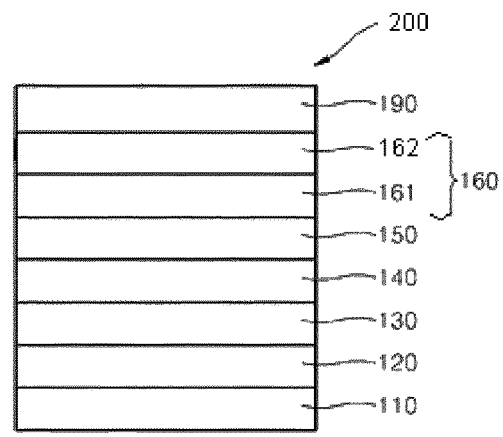
FIG. 3 is a schematic sectional view of an OLED, according to an exemplary embodiment of the present invention having no electron injection layer (EIL).

FIG. 3 is a schematic sectional view of an OLED 200, according to another exemplary embodiment of the present invention. FIG. 3 differs from FIG. 2 in that the OLED 100 of FIG. 3 has no electron injection layer (EIL) 180

Referring to FIG. 3 the OLED 200 includes a substrate 110, a first electrode 120, a HIL 130, a HTL 140, an EML 150, an ETL 160, and a second electrode 190. The ETL stack 160 includes a first ETL layer 161 and a second ETL layer 162.

The electron transport layer stack 160 of at least two electron transport layers 161 and 162, wherein a first electron transport layer 161 and a second electron transport layer 162 comprises at least one matrix compound and in addition,
the first electron transport layer comprises a first lithium halide or a first lithium organic complex; and
the second electron transport layer comprises a second lithium halide or a second lithium organic complex; wherein the first lithium organic complex is not the same as the second lithium organic complex and wherein the first lithium halide is not the same as the second lithium halide; wherein the first electron transport layer is arranged closest to an anode and the second electron transport layer is arranged closest to a cathode.

The layers of the ETL 161 and 162 have similar or identical energy levels, so that the injection and transport of the electrons may be controlled, and the holes may be efficiently blocked. Thus, the OLED 200 may have long lifetime.

The substrate 110, the first electrode 120, the hole injection layer 130, the hole transport layer 140, the emission layer 150, and the electron transport layer 161 and 162 of the OLED 200 are similar to corresponding elements described with reference to FIG. 2. Even though the structure of the OLED 200 and the method of manufacturing the OLED 200 are described with reference to FIG. 2, other method known in the art can be used. For example, the ETL stack 160 may include three or more ETL layers but two ETL layers of ETL 161 and 162 are preferred.

In the description above the method of manufacture an OLED of the present invention is started with a substrate 110 onto which a first anode electrode 120 is formed, on the first anode electrode 120 an emission layer 150 is formed. An electron transport layer stack 160 is formed on the emission layer 150, wherein the first electron transport layer 161 is formed on the emission layer 150 and the second electron transport layer 162 is formed directly on the first electron transport layer 162, on the electron transport layer stack 160, in this case on the second electron transport layer 162 a second cathode electrode 190 is formed, optional a hole injection layer 130, and a hole transport layer 140, are formed in that order between the first anode electrode 120 and the electron transport layer 160, an optional hole blocking layer is formed between the emission layer and the ETL layer stack, and optionally an electron injection layer 180 is formed between the electron transport layer 160 and the second cathode electrode 190. However, the OLED of the present invention can be manufactured also the other way around, starting with the second cathode electrode 190 onto which optionally an electron injection layer 180 is formed. On the second cathode electrode 190 or on the electron injection layer 180, if present, the second electron transport layer 162 is formed and directly on the second electron transport layer 162 the first electron transport layer 161 is formed and so on.

While not shown in FIGS. 2 and 3, a sealing layer may further be formed on the second electrodes 190, in order to seal the OLEDs 100, 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

EXAMPLES

General Procedure

For bottom emission devices, a 15 Ω/cm$^2$ glass substrate (available from Corning Co.) with 90 nm ITO was cut to a size of 50 mm×50 mm×0.7 mm, ultrasonically washed with isopropyl alcohol for 5 minutes and then with pure water for 5 minutes, and washed again with UV ozone for 30 minutes, to prepare a first electrode. For top emission devices, the anode electrode was formed from 100 nm silver on glass which was prepared by the same methods as described above.

Then, 92 wt.-% of N4,N4"-di(naphthalen-1-yl)-N4,N4"-diphenyl-[1,1':4',1"-terphenyl]-4,4"-diamine and 8 wt.-% of 2,2',2"-(cyclopropane-1,2,3-triylidene)tris(2-(p-cyanotetrafluorophenyl)acetonitrile) was vacuum deposited on the ITO electrode, to form a HIL having a thickness of 10 nm. Then N4,N4"-di(naphthalen-1-yl)-N4,N4"-diphenyl-[1,1':4',1"-terphenyl]-4,4"-diamine was vacuum deposited on the HIL, to form a HTL having a thickness of 130 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then the ETL-layer stack is formed by depositing the first electron transport layer (ETL 1) including a matrix compound according to Example 1 to Example 39 by deposing the matrix compound from a first deposition source and the lithium organic complex or lithium halide of from a second deposition source directly on the EML.

Then the second electron transport layer (ETL 2) including a matrix compound according to Example 1 to Example 39 is formed by deposing the matrix compound from a first deposition source, if the same matrix compound is used as in the first electron transport layer, or a third deposition source, if the matrix compound is different from the matrix compound used in the first electron transport layer, and the lithium organic complex or lithium halide from a third or fourth deposition source directly on the first electron transport layer (ETL 1).

For the comparative examples 1 to 12 only one electron transport layer is formed, either an ETL 1 or an ETL 2.

The wt.-% of the lithium organic complex for the ETL1 as well as for the ETL 2 can be taken from Tables 4 to 7, whereby the wt.-% amount of the matrix compound is added to 100 wt.-% respectively. That means, that the matrix compound of ETL 1 are added in a wt.-% amount such that the given wt.-% of the lithium organic complex for the ETL1 and the matrix compound of the ETL 1 are in total 100 wt.-%, based on the weight of the ETL 1; and, the matrix compound of ETL 2 are added in a wt.-% amount such that the given wt.-% of the lithium organic complex for the ETL2 and the matrix compound of the ETL 2 are in total 100 wt.-%, based on the weight of the ETL 2. Further, the thickness d (in nm) of the ETL 1 and ETL 2 can be taken from Tables 4 to 7. The cathode was evaporated at ultra-high vacuum of $10^{-7}$ bar. Therefore, a thermal single co-evaporation of one or several metals was performed with a rate of 0, 1 to 10 nm/s (0.01 to 1 Å/s) in order to generate a homogeneous cathode with a thickness of 5 to 1000 nm. For top emission devices, the cathode electrode was formed from 13 nm magnesium (90 vol.-%)-silver (10 vol.-%) alloy. For bottom emission devices, the cathode electrode was formed from 100 nm aluminium.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 15 mA/cm$^2$, a calibrated spectrometer CAS140 from Instrument Systems is used for measurement of CIE coordinates and brightness in Candela. Lifetime LT of the device is measured at ambient conditions (20° C.) and 15 mA/cm$^2$, using a Keithley 2400 sourcemeter, and recorded in hours. The brightness of the device is measured using a calibrated photo diode. The lifetime LT is defined as the time till the brightness of the device is reduced to 97% of its initial value.

In top emission devices, the emission is forward directed, non-Lambertian and also highly dependent on the mircocavity. In order to minimize the effect of the micro-cavity and thus of the emission color on the device performance, the efficiency Eff. is measured in Candela per Ampere (cd/A) and divided by the CIE-y. These values are recorded in the Tables below. The efficiency of the bottom emission devices was calculated in the same way.

TECHNICAL EFFECT OF THE INVENTION

Top Emission Devices a) Efficiency Improvement with Two Electron Transport Layers (ETL1 and ETL 2)

In Table 4 results are shown for top emission devices with two different matrix compounds in the ETL-stack of first electron transport layer (ETL1) and second electron transport layer (ETL 2). An efficiency improvement is observed compared to the emission device with one electron transport layer only—see Table 4.

TABLE 4

Efficiency improvement Eff/CIE-y in top emission OLED with two electron transport layer

| | ETL1 | wt.-% lithium organic complex*[1] | d(ETL1)/ nm | ETL2 | wt.-% lithium organic complex*[2] | d(ETL1)/ nm | V at 15 mA/cm$^2$/V | Eff/ CIE-y | CIE y | LT (RT)/h |
|---|---|---|---|---|---|---|---|---|---|---|
| Comparative example 1 | MX 2:LiQ | 50 | 36 | | 50 | 0 | 4.71 | 90 | 0.051 | 41.45 |
| Example 1 | MX 5:LiQ | 50 | 10 | MX 2:Li-1 | 50 | 26 | 4.22 | 99 | 0.056 | 32 |

*[1]= the wt.-% of the matrix compound and the wt.-% of the lithium organic complex are in total 100 wt.-% based on weight of the ETL1
*[2]= the wt.-% of the matrix compound and the wt.-% of the lithium organic complex are in total 100 wt.-% based on weight of the ETL2

TABLE 5

Efficiency improvement in top emission OLED with two ET layers of ETL 1 and ETL 2 compared to one ET layer

| | ETL1 | wt.-% lithium organic complex*[1] | d(ETL1)/ nm | ETL2 | wt.-% lithium organic complex*[2] | d(ETL2)/ nm | V at 15 mA/cm$^2$/V | Eff/ CIE-y | CIE-y | LT (RT)/h |
|---|---|---|---|---|---|---|---|---|---|---|
| Comparative example 2 | MX 2:LiQ | 50 | 36 | | 0 | 0 | 4.50 | 99 | 0.043 | 178 |
| Example 2 | MX 2:Li-2 | 50 | 3 | MX 2:LiQ | 50 | 33 | 4.60 | 106 | 0.047 | 156 |
| Example 3 | MX 2:Li-2 | 50 | 5 | MX 2:LiQ | 50 | 31 | 4.62 | 108 | 0.047 | 160 |
| Example 4 | MX 2:Li-2 | 50 | 11 | MX 2:LiQ | 50 | 25 | 4.81 | 107 | 0.048 | 160 |
| Example 5 | MX 2:Li-2 | 50 | 19 | MX 2:LiQ | 50 | 17 | 4.92 | 111 | 0.048 | 160 |
| Comparative example 3 | MX 2:LiQ | 50 | 36 | | 0 | 0 | 4.50 | 99 | 0.043 | 178 |
| Example 6 | MX 2:Li-1 | 20 | 3 | MX 2:LiQ | 50 | 33 | 4.71 | 107 | 0.045 | 75 |
| Example 7 | MX 2:Li-1 | 20 | 5 | MX 2:LiQ | 50 | 31 | 4.84 | 113 | 0.045 | 70 |
| Example 8 | MX 2:Li-1 | 20 | 10 | MX 2:LiQ | 50 | 26 | 5.06 | 109 | 0.0515 | 47 |
| Example 9 | MX 2:Li-1 | 20 | 18 | MX 2:LiQ | 50 | 18 | 5.16 | 117 | 0.051 | 25 |
| Comparative Example 4 | MX 2:LiQ | 50 | 36 | | 0 | 0 | 4.63 | 102 | 0.047 | 140 |
| Comparative example 6 | MX 2:Li-2 | 50 | 36 | | 0 | 0 | 4.77 | 115 | 0.049 | 70 |
| Example 10 | MX 2:Li-1 | 20 | 9 | MX 2:Li-2 | 50 | 27 | 5.06 | 125 | 0.049 | 44 |
| Example 11 | MX 2:Li-1 | 20 | 18 | MX 2:Li-2 | 50 | 18 | 5.17 | 134 | 0.049 | 27 |
| Comparative example 7 | MX 2:LiQ | 50 | 36 | | 0 | 0 | 4.97 | 99 | 0.038 | 217 |
| Comparative example 8 | MX4:Li-2 | 60 | 36 | | 0 | 0 | 5.30 | 95 | 0.036 | 259 |
| Example 12 | MX4:Li-2 | 60 | 11 | MX4:Li-1 | 20 | 26 | 4.51 | 132 | 0.041 | 38 |
| Example 13 | MX4:Li-2 | 60 | 14 | MX4:Li-1 | 20 | 23 | 4.54 | 126 | 0.039 | 97 |
| Example 14 | MX4:Li-2 | 60 | 16 | MX4:Li-1 | 20 | 20 | 4.69 | 115 | 0.038 | 94 |
| Example 15 | MX4:Li-2 | 60 | 20 | MX4:Li-1 | 20 | 16 | 4.84 | 114 | 0.041 | 116 |
| Example 16 | MX4:Li-2 | 60 | 23 | MX4:Li-1 | 20 | 14 | 4.93 | 107 | 0.038 | 116 |
| Example 17 | MX4:Li-2 | 60 | 26 | MX4:Li-1 | 20 | 11 | 4.98 | 108 | 0.038 | 180 |
| Comparative example 9 | MX 2:LiQ | 50 | 36 | | 0 | 0 | 4.74 | 93 | 0.051 | 166 |
| Comparative example 10 | MX 1:LiQ | 50 | 36 | | 0 | 0 | 4.01 | 86 | 0.057 | 60 |
| Comparative example 11 | MX 1:Li-2 | 50 | 36 | | 0 | 0 | 4.05 | 98 | 0.054 | 31 |
| Example 18 | MX 1:Li-2 | 50 | 9 | MX 1:LiQ | 50 | 27 | 3.97 | 108 | 0.044 | 32 |
| Example 19 | MX 1:Li-2 | 50 | 18 | MX 1:LiQ | 50 | 18 | 3.99 | 110 | 0.044 | 25 |

*[1]= the wt.-% of the matrix compound and the wt.-% of the lithium organic complex are in total 100 wt.-% based on weight of the ETL1
*[2]= the wt.-% of the matrix compound and the wt.-% of the lithium organic complex are in total 100 wt.-% based on weight of the ETL2

Table 5 above shows an efficiency improvement for an OLED with two electron transport layers according to the invention compared with the same OLED with one ET layer only.

This beneficial effect is already noticeable even for very thin second ETL2, see Example 2 and Example 3 in Table 5 above. The largest increased in efficiency is typically observed for a thickness of 15 nm to 20 nm for the first electron transport layer ETL 1, see Examples 5, 9, 11. The positive effect on efficiency is observed for a wide percentage of lithium organic complexes, for example when using 20 wt.-% of lithium organic complex, while in other examples 50 or 60 wt.-% was used.

The highest efficiency in absolute terms is achieved for matrix compounds containing phosphine oxides, in particular (3-(dibenzo[c,h]acridin-7-yl)phenyl)diphenylphosphine oxide and 3-phenyl-3H-benzo[b]dinaphtho[2,1-d:1',2'-f] phosphepine-3-oxide with lithium organic complexes of lithium 8-hydroxyquinolate, lithium tetra(1H-pyrazol-1-yl) borate and lithium 2-(diphenylphosphoryl)phenolate, respectively Examples 11 and 12.

In case where matrix compounds were used which contain at least one phosphine oxide group an increase in efficiency can also be seen for a hetero substituted anthracene based matrix compound, respectively Examples 18 and 19 in Table 5.

At comparable LT, devices comprising phosphine oxide matrix compounds show higher efficiency Eff/CIE-y compared to hetero substituted anthracene based matrix compound, Examples 9 and 11, and 18 and 19, respectively.

Compared to Table 4 above, the beneficial effect on increasing the efficiency can be achieved by using for ETL 1 and ETL 2 the same matrix compound. This is of particular interest in manufacturing, as fewer deposition sources are required.

Lifetime improvement for OLEDs with two ET layers is further shown in Table 6. The lifetime is improved even with a very thin second ET layer, see Example 20. The best lifetime in absolute terms is achieved for (3-(dibenzo[c,h] acridin-7-yl)phenyl)diphenylphosphine oxide and lithium organic complexes lithium 8-hydroxyquinolate and lithium tetra(1H-pyrazol-1-yl)borate (Example 25).

TABLE 6

Lifetime improvement in top emission OLED with two ET layers

| | ETL1 | wt.-% lithium organic complex[*1] | d(ETL1)/ nm | ETL2 | wt.-% lithium organic complex[*2] | d(ETL2)/ nm | V at 15 mA/cm$^2$/V | Eff/ CIE-y | CIE-y | LT (RT)/h |
|---|---|---|---|---|---|---|---|---|---|---|
| Example 20 | MX 2:LiQ | 50 | 3 | MX 2:Li-2 | 50 | 33 | 4.61 | 105 | 0.043 | 105 |
| Example 21 | MX 2:LiQ | 50 | 6 | MX 2:Li-2 | 50 | 30 | 4.60 | 106 | 0.043 | 110 |
| Example 22 | MX 2:LiQ | 50 | 10 | MX 2:Li-2 | 50 | 26 | 4.68 | 106 | 0.041 | 110 |
| Example 23 | MX 2:LiQ | 50 | 18 | MX 2:Li-2 | 50 | 18 | 4.65 | 104 | 0.041 | 105 |
| Example 24 | MX 2:LiQ | 50 | 18 | MX 2:Li-1 | 20 | 18 | 4.20 | 106 | 0.042 | 95 |
| Example 25 | MX 2:LiQ | 50 | 26 | MX 2:Li-1 | 20 | 10 | 4.45 | 101 | 0.042 | 150 |
| Example 26 | MX 2:Li-2 | 50 | 10 | MX 2:Li-1 | 20 | 27 | 4.08 | 129 | 0.048 | 33 |
| Example 26 | MX 2:Li-2 | 50 | 19 | MX 2:Li-1 | 20 | 17 | 4.21 | 125 | 0.048 | 44 |
| Example 27 | MX 2:Li-3 | 50 | 9 | MX 2:Li-2 | 50 | 27 | 4.72 | 108 | 0.049 | 91 |
| Example 28 | MX 2:Li-3 | 50 | 18 | MX 2:Li-2 | 50 | 18 | 4.69 | 106 | 0.049 | 109 |

[*1] = the wt.-% of the matrix compound and the wt.-% of the lithium organic complex are in total 100 wt.-% based on weight of the ETL1
[*2] = the wt.-% of the matrix compound and the wt.-% of the lithium organic complex are in total 100 wt.-% based on weight of the ETL2

Bottom Emission Devices

In Table 7 below efficiency data are summarized for bottom emission devices with one matrix compound. Examples 29 and 30 have higher efficiency than the bottom emission OLED of Comparative Example 12. Improved efficiency is observed independent of the direction of light output.

In Example 31 to 33, different Li organic complexes are tested in phenanthroline matrix compound MX 9. Even for this matrix compound, which has very different chemical structure compared phosphine oxide compounds MX 2 and MX 4, improved Eff/CIE-y is observed for a range of different Li organic complexes in ETL1 and ETL2. The beneficial effect is observed for a wide range of matrix compounds, see Table 1, and Li organic complexes, see Table 2.

The double ETL of a first electron transport layer and of a second electron transport layer could also be employed for other emission colors, for example green, red, and white-light emitting devices.

Another aspect is directed to a device comprising at least one organic light-emitting diode (OLED). A device comprising organic light-emitting diodes (OLED) is for example a display.

From the foregoing detailed description and examples, it will be evident that modifications and variations can be made to the compositions and methods of the invention without departing from the spirit and scope of the invention. Therefore, it is intended that all modifications made to the invention without departing from the spirit and scope of the invention come within the scope of the appended claims.

TABLE 7

Efficiency improvement in bottom emission devices with one matrix compound

| | ETL1 | wt.-% lithium organic complex[*1] | d(ETL1)/ nm | ETL2 | wt.-% lithium organic complex[*2] | d(ETL2)/ nm | V at 15 mA/cm$^2$/V | Eff/ CIE-y | CIE-y | LT (RT)/h |
|---|---|---|---|---|---|---|---|---|---|---|
| Comparative example 12 | MX 2:LiQ | 50 | 36 | 0 | 0 | 0 | 5.00 | 55 | 0.092 | 200 |
| Example 29 | MX 2:Li-6 | 50 | 10 | MX 2:LiQ | 50 | 26 | 5.35 | 60 | 0.093 | 125 |
| Example 30 | MX 2:Li-6 | 50 | 10 | MX 2:Li-3 | 50 | 26 | 5.24 | 60 | 0.093 | 100 |
| Example 31 | MX 9:Li-2 | 50 | 10 | MX 9:Li-1 | 30 | 26 | 5.09 | 81 | 0.094 | 8 |
| Example 32 | MX 9:Li-1 | 30 | 10 | MX 9:Li-2 | 50 | 26 | 5.43 | 69 | 0.093 | 37 |
| Example 33 | MX 9:Li-2 | 30 | 10 | MX 9:LiQ | 50 | 26 | 5.71 | 67 | 0.095 | 13 |

[*1] = the wt.-% of the matrix compound and the wt.-% of the lithium organic complex are in total 100 wt.-% based on weight of the ETL1
[*2] = the wt.-% of the matrix compound and the wt.-% of the lithium organic complex are in total 100 wt.-% based on weight of the ETL2

In the same way as described above, a first electron transport layer 161 comprising a matrix compound and lithium fluoride (LiF) may be deposited on the emission layer 150, followed by deposition of a second electron transport layer 162 comprising a matrix compound and a lithium organic complex.

Similarly, a first electron transport layer 161 comprising a matrix compound and a lithium organic complex may be deposited on the emission layer 150, followed be deposition of a second electron transport layer comprising matrix compound and lithium fluoride (LiF). In both device examples, the concentration of lithium fluoride in the matrix material is between 10 and 50 wt.-%

The invention claimed is:

1. An organic light-emitting diode (OLED) comprising an emission layer and an electron transport layer stack of at least two electron transport layers, wherein a first electron transport layer and a second electron transport layer comprises at least one matrix compound and in addition,
the first electron transport layer comprises a first lithium halide or a first lithium organic complex; and
the second electron transport layer comprises a second lithium halide or a second lithium organic complex, wherein the first lithium organic complex is not the same as the second lithium organic complex and wherein the first lithium halide is not the same as the second lithium halide, and wherein the at least one matrix compound of the first electron transport layer and the second electron transport layer comprises a phosphine oxide based compound and/or a substituted phenanthroline compound.

2. The OLED comprising the electron transport layer stack according to claim 1, wherein the first electron transport layer and the second electron transport layer comprises the least one matrix compound, whereby the at least one matrix compound of the first electron transport layer and the second electron transport layer are the same.

3. The OLED comprising the electron transport layer stack according to claim 1, wherein
the first electron transport layer comprises about ≥10 wt.-% to about ≤70 wt.-% of the first lithium halide or the first lithium organic complex; and
the second electron transport layer comprises about ≥10 wt.-% to about ≤70 wt.-% of the second lithium halide or the second lithium organic complex;
wherein the weight percent of the first lithium halide and the first lithium organic complex is based on the total weight of the corresponding first electron transport layer and the weight percent of the second lithium halide and the second lithium organic complex is based on the total weight of the corresponding second electron transport layer.

4. The OLED comprising the electron transport layer stack according to claim 1, wherein
the amount of the first lithium halide or the first lithium organic complex in the first electron transport layer is in the range of about ≥10 mol-% to about ≤95 mol-%, by weight of the first electron transport layer; and/or
the amount of the second lithium halide or the second lithium organic complex in the second electron transport layer is in the range of about ≥10 mol-% to about ≤95 mol-%, by weight of the second electron transport layer.

5. The OLED comprising the electron transport layer stack according to claim 1, wherein the lithium halide, is a LiF, LiCl, LiBr or LiI, and an organic ligand of the lithium organic complex is a quinolate, a borate, a phenolate, a pyridinolate or a Schiff base ligand.

6. The OLED comprising the electron transport layer stack according to claim 1, wherein the first electron transport layer and the second electron transport layer comprises the at least one matrix compound, wherein the at least one matrix compound further comprises an anthracene based compound or a hetero substituted anthracene based compound.

7. The OLED comprising the electron transport layer stack according to claim 1, wherein the electron transport layer stack has two to four electron transport layers.

8. The OLED comprising the electron transport layer stack according to claim 1, wherein the second electron transport layer is arranged directly on the first electron transport layer.

9. The OLED comprising the electron transport layer stack according to claim 1, wherein the electron transport layer stack is arranged between two electrodes, namely a first anode electrode and a second cathode electrode.

10. The OLED comprising the electron transport layer stack according to claim 1, wherein
the first electron transport layer comprises:
a) about ≥10 wt.-% to about ≤70 wt.-% of the lithium halide, selected from the group comprising a LiF, LiCl, LiBr or LiI, or of the lithium organic complex of a lithium quinolate, a borate, a phenolate, a pyridinolate or a Schiff base ligand;
b) about ≤90 wt.-% to about ≥30 wt.-% of the matrix compound of:
an anthracene based compound or a hetero substituted anthracene based compound; or
the phosphine oxide based compound; or
the substituted phenanthroline compound;
the second electron transport layer comprises:
c) about ≥10 wt.-% to about ≤70 wt.-% of the lithium halide, selected from the group comprising a LiF, LiCl, LiBr or LiI, or of the lithium organic complex of a lithium quinolate, a borate, a phenolate, a phenolate, a pyridinolate or a Schiff base ligand;
d) about ≤90 wt.-% to about ≥30 wt.-% of the matrix compound of:
an anthracene based compound or a hetero substituted anthracene based compound; or
the phosphine oxide based compound; or
the substituted phenanthroline compound; whereby
the first lithium organic complex a) of the first electron transport layer is not the same as the second lithium organic complex c) of the second electron transport layer; and the wt.-% of the components of the first electron transport layer are selected such that the total wt.-% amount does not exceed 100 wt.-% and the wt.-% of the components of the second electron transport layer are selected such that the total wt.-% amount does not exceed 100 wt.-%, and the wt.-% of the components of the first electron transport layer are based on the total weight of the first electron transport layer and the wt.-% of the components of the second electron transport layer are based on the total weight of the second electron transport layer.

11. The OLED comprising the electron transport layer stack according to claim 1, wherein
the first electron transport layer comprises about ≥50 wt.-% to about ≤60 wt.-% of the first lithium halide or the first lithium organic complex and about ≤50 wt.-% to about ≥40 wt.-% of:
the phosphine oxide based compound; or
the substituted phenanthroline compound; and
the second electron transport layer comprises about ≥10 wt.-% to about ≤30 wt.-% of the second lithium halide or the second lithium organic complex and about ≤90 wt.-% to about ≥70 wt.-% of:
the phosphine oxide based compound; or
the substituted phenanthroline compound.

12. The OLED comprising the electron transport layer stack according to claim 1, wherein
the first electron transport layer comprises about ≥50 wt.-% to about ≤60 wt.-% of a lithium 8-hydroxyquinolate and about ≤50 wt.-% to about ≥40 wt.-% of a (3-(dibenzo[c,h]acridin-7-yl)phenyl)diphenylphosphine oxide; and
the second electron transport layer comprises about ≥10 wt.-% to about ≤30 wt.-% of a lithium tetra(1H-pyrazol-1-yl)borate and about ≤90 wt.-% to about ≥70 wt.-% of a (3-(dibenzo[c,h]acridin-7-yl)phenyl)diphenylphosphine oxide.

13. The OLED according to claim 1 comprising: a substrate; a first anode electrode, which is arranged on the substrate; a second cathode electrode; and the electron transport layer stack, which is arranged between the first anode electrode and the second cathode electrode, wherein the electron transport layer stack comprises or consists of the at least two electron transport layers.

14. The OLED according to claim 13, further comprising at least one layer selected from the group consisting of a hole injection layer, a hole transport layer, and a hole blocking layer, arranged between the first anode electrode and the electron transport layer.

15. The OLED according to claim 13, further comprising an electron injection layer arranged between the electron transport layer and the second cathode electrode.

16. A method of manufacturing an organic light-emitting diode (OLED) according to claim 1, the method comprising:
at least three deposition sources; and/or
deposition via vacuum thermal evaporation; and/or
deposition via solution processing.

17. A method of manufacturing an organic light-emitting diode (OLED) according to claim 16, the method comprising:
a first deposition source to release the at least one matrix compound, and
a second deposition source to release lithium halide or lithium organic complex;
the method comprising the steps of forming the electron transport layer stack;
whereby the first electron transport layer is formed by releasing the at least one matrix compound from the first deposition source and the first lithium halide or lithium organic complex from the second deposition source;
onto the first electron transport layer the second electron transport layer is formed by releasing the at least one matrix compound from a third deposition source and the second lithium halide or lithium organic complex from a fourth deposition source;
whereby the first lithium organic complex is not the same as the second lithium organic complex; and whereby the first lithium halide is not the same as the second lithium halide.

18. The method of claim 16, comprising the steps for an organic light-emitting diode (OLED), wherein
on a substrate a first anode electrode is formed,
on the first anode electrode an electron transport layer stack is formed,
on the electron transport layer stack a second cathode electrode is formed,
optional a hole injection layer, a hole transport layer, an emission layer, and a hole blocking layer, formed in that order between the first anode electrode and the electron transport layer,
optional an electron injection layer is formed between the electron transport layer and the second cathode electrode.

19. A device comprising at least one organic light-emitting diode (OLED) of claim 1.

20. The OLED comprising the electron transport layer stack according to claim 5, wherein the organic ligand of the lithium organic complex is the quinolate, and the lithium organic complex has the formula I, II, or III:

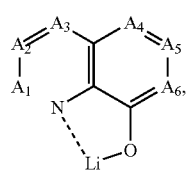
(I)

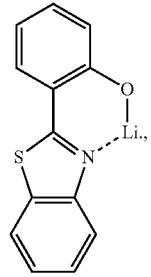
(II)

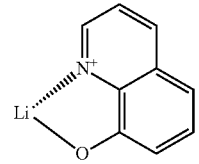
(III)

wherein
A1 to A6 are same or independently selected from CH, CR, N, O;
R is same or independently selected from hydrogen, halogen, alkyl or aryl or heteroaryl with 1 to 20 carbon atoms.

21. The OLED comprising the electron transport layer stack according to claim 20, wherein A1 to A6 are CH.

22. The OLED comprising the electron transport layer stack according to claim 5, wherein the borate based organic ligand is a tetra(1H-pyrazol-1-yl)borate.

23. The OLED comprising the electron transport layer stack according to claim 5, wherein the phenolate is a 2-(pyridin-2-yl)phenolate, a 2-(diphenylphosphoryl)phenolate, an imidazole phenolate, or 2-(pyridin-2-yl)phenolate.

24. The OLED comprising the electron transport layer stack according to claim 10, wherein the phosphine oxide based compound of the first electron transport layer is (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide.

25. The OLED comprising the electron transport layer stack according to claim 10, wherein the phosphine oxide based compound of the first electron transport layer is (3-(dibenzo[c,h]acridin-7-yl)phenyl)diphenylphosphine oxide.

26. The OLED comprising the electron transport layer stack according to claim 10, wherein the phosphine oxide compound of the second electron transport layer is (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide.

27. The OLED comprising the electron transport layer stack according to claim 10, wherein the phosphine oxide compound of the second electron transport layer is (3-(dibenzo[c,h]acridin-7-yl)phenyl)diphenylphosphine oxide.

28. The OLED comprising the electron transport layer stack according to claim 11, wherein the phosphine oxide based compound of the first electron transport layer is (3-(dibenzo[c,h]acridin-7-yl)phenyl)diphenylphosphine oxide, 3-phenyl-3H-benzo[b]dinaphtho[2,1-d:1',2'-f]phosphepine-3-oxide, and/or phenyl bis(3-(pyren-1-yl)phenyl) phosphine oxide.

29. The OLED comprising the electron transport layer stack according to claim 11, wherein the phosphine oxide based compound of the second electron transport layer is (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl) phosphine oxide.

* * * * *